(12) United States Patent
Fathollahi et al.

(10) Patent No.: US 9,642,222 B2
(45) Date of Patent: May 2, 2017

(54) LIGHT BULB ADAPTER

(71) Applicant: INCIPIO, LLC, Irvine, CA (US)

(72) Inventors: Andy Fathollahi, Corona Del Mar, CA (US); Ahmed Abdallah, Mission Viejo, CA (US)

(73) Assignee: INCIPIO, LLC, Irvine, CA (US)

( * ) Notice: Subject to any disclaimer, the term of this patent is extended or adjusted under 35 U.S.C. 154(b) by 0 days.

(21) Appl. No.: 14/978,795

(22) Filed: Dec. 22, 2015

(65) Prior Publication Data

US 2016/0198553 A1 Jul. 7, 2016

Related U.S. Application Data

(60) Provisional application No. 62/100,046, filed on Jan. 5, 2015.

(51) Int. Cl.
| | |
|---|---|
| *H05B 37/00* | (2006.01) |
| *H05B 37/02* | (2006.01) |
| *H01R 33/945* | (2006.01) |
| *G01R 22/06* | (2006.01) |

(52) U.S. Cl.
CPC ..... *H05B 37/0272* (2013.01); *H01R 33/9453* (2013.01); *H05B 37/0236* (2013.01); *G01R 22/063* (2013.01); *G01R 22/065* (2013.01); *Y02B 20/48* (2013.01)

(58) Field of Classification Search
CPC ..... H04W 88/02; H04W 24/02; H04W 48/18; H04W 4/02; H04W 72/06; H04W 88/06; H04W 4/005; H04W 84/12; H04W 88/08; G06F 17/30274; G06F 17/3028; G06F 1/16; G06F 1/1601; G06F 1/1605; G06F 1/1616

See application file for complete search history.

(56) References Cited

U.S. PATENT DOCUMENTS

| | | | | |
|---|---|---|---|---|
| 2012/0080944 A1* | 4/2012 | Recker | ...................... | H02J 9/02 307/25 |
| 2013/0125031 A1* | 5/2013 | Calica | ................... | G06F 3/0484 715/764 |

OTHER PUBLICATIONS

Phil Dzikiy, "Show Report: Incipio/Braven," http://www.ilounge.com/index.php/ces/report/incipio-braven.

* cited by examiner

*Primary Examiner* — Monica C King

(74) *Attorney, Agent, or Firm* — Manatt, Phelps & Phillips, LLP

(57) ABSTRACT

A light bulb adapter is disclosed. The light bulb adapter has a main housing configured to house electronic circuits for wirelessly receiving controlling commands via WiFi from a user through the use of a software application installed in a mobile device. In operation, the user unplug a light bulb from an existing lighting fixture and plugs the light bulb plug of the light bulb adapter into the lighting fixture. A light bulb is inserted to the light bulb receptacle of the light bulb adapter. The user can connect a mobile device to the light bulb adapter over a wireless local area network via an accessory protocol and control the light bulb adapter, and subsequently the light bulb connected to it, using the accessory protocol.

12 Claims, 24 Drawing Sheets

LIGHT BULB ADAPTER

INCORPORATION BY REFERENCE TO RELATED APPLICATIONS

This application claims benefit under 35 U.S.C. §119(e) from U.S. Provisional Application No. 62/100,046, filed on Jan. 5, 2015, which is hereby incorporated by reference in its entirety.

BACKGROUND OF THE INVENTION

Field of the Invention

This patent document relates to light bulb adapters and method of use thereof, and more particularly pertains to new and improved light bulb adapters that are capable of being wirelessly controlled.

Description of the Related Art

Lighting surrounds us nearly everywhere in today's business and residential communities and provides appreciable benefits that we have come to rely upon and expect in our day-to-day lives. In urban and home environments, control switches are typically mounted on a wall or on a chord to facilitate control of the light fixture. Such control switches can be inconveniently located and are often left on resulting in wasted energy. While integrated lighting management systems can allow for remote and automated control of lighting, such systems can be quite costly and require installation of new fixtures and components to operate, which render such systems out of financial reach for many well intentioned consumers. In an going effort to continue to improve upon the efficiencies, accessibility and usability of lighting fixtures, the inventors here have recognized a need for a light bulb adapter that is configured to connect to a lighting fixture and that can wirelessly control the power to the light bulb via a user's mobile device, such as a smart phone or tablet computer.

SUMMARY OF THE INVENTION

There exists a continuing need for a light bulb adapter with built-in circuitry adapted to control the light bulb plugged therein wirelessly via a remote mobile electronic device such as a smart phone or tablet computer. The adaptor may also be controlled manually via interactive externally positioned switches or buttons. Some of the various aspects disclosed herein are summarized below.

In one aspect, a light bulb adapter comprises an upper portion or shell and a base that define an internal compartment or main housing that houses electronic components and circuitry for controlling the adapter. The upper portion includes an external cavity that is configured to receive and support a light bulb receptacle or socket on its external surface and the base is configured to include and outwardly protruding support structure that is configured to receive and support a light bulb plug. The light bulb receptacle is configured to receive a light bulb. The light bulb plug is configured to connect to a corresponding lighting fixture. The shell has an outer side wall, an upper wall, an inner side wall and a lower wall, wherein the inner side wall and the lower wall define a cavity configured to surround and support the light bulb receptacle. The base is configured to connect with the lower end region of the outer wall of the shell to define the internal compartment or main housing, which in turn is configured to house electronic circuitry that wirelessly communicates with a user through a software application installed in a mobile device to control the power to the light bulb.

The configuration of the upper shell and base portion as well as the manner by which the upper shell portion is connected to the base portion constitute additional aspects of the disclosed adaptor.

The manner by which the light bulb receptacle or socket components and the light bulb plug components including the electrical contacts are mounted to the shell constitute yet other aspects of the disclosed adaptor.

The various electronic components and circuitry and their relative position within the housing and to one another constitute yet additional aspects of the disclosed adaptor.

Functionality, position, and configuration of the user interfaces and indicators of constitute yet other additional aspects of the disclosed adaptor.

The methods of manufacture and use of the adaptor constitute yet additional aspects of the disclosure.

The ornamental aspects of the external shape of the adaptor provide yet additional aspects of the disclosure and may be independently pursued through design patent protection.

Each of the foregoing various aspects summarized above and disclosed herein may be combined in any way without limitation.

BRIEF DESCRIPTION OF THE DRAWINGS

These aspects, particular features, and advantages are described below with reference to the drawings, which are intended to illustrate but not to limit the scope of the inventive subject matter disclosed herein. For ease of reference, in the drawings, like reference characters denote corresponding features in other drawings.

DETAILED DESCRIPTION OF THE PREFERRED EMBODIMENT

Disclosed herein are embodiments of a light bulb adapter with built-in electronic circuits configured to allow the user to control the light bulb adapter, and subsequently the light bulb connected to it through a software application installed on a mobile device, such as a smart phone or tablet computer. Manual control is also provided via user interface buttons or switches externally accessible.

Figure 1:
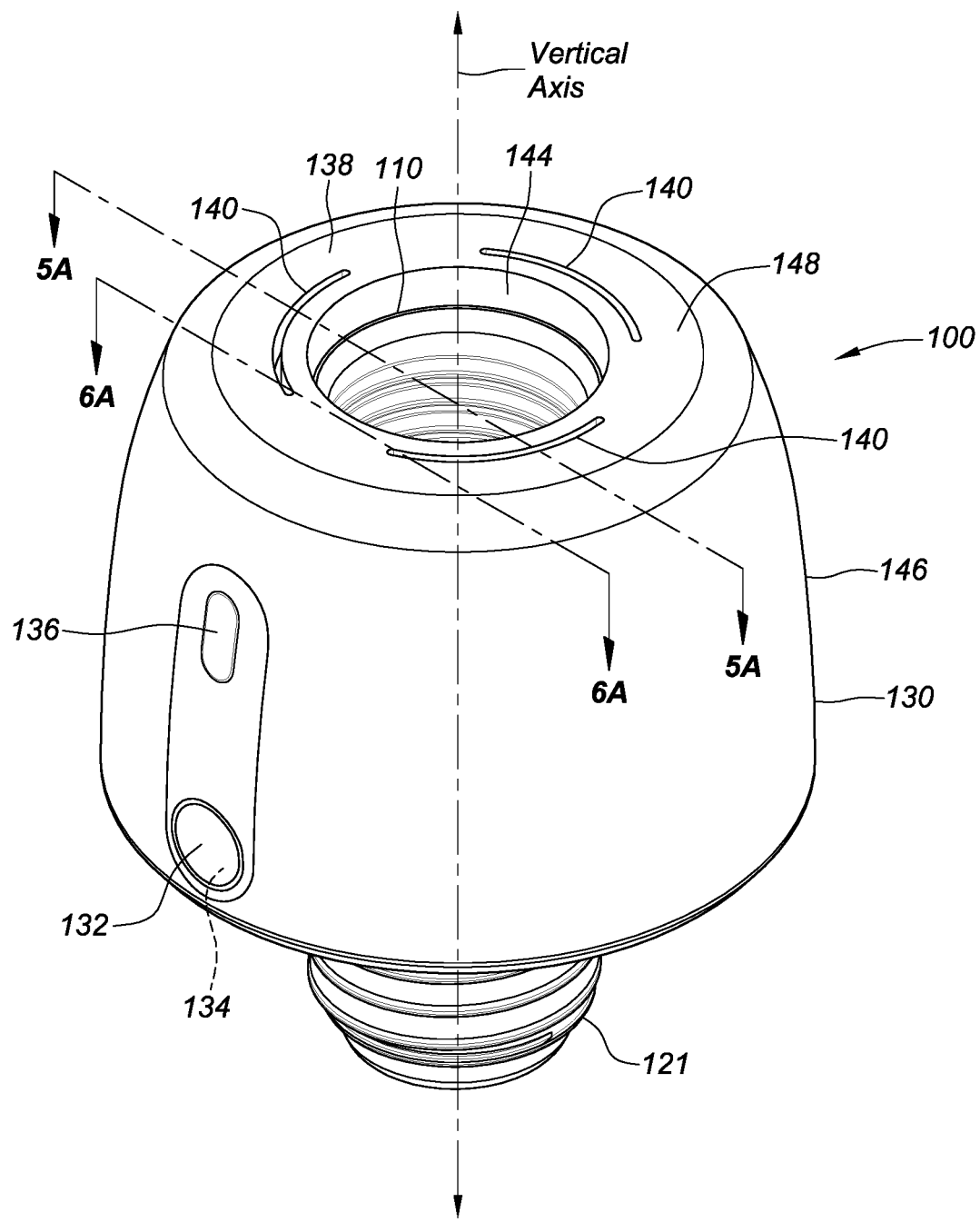
FIG. 1 is a perspective view of an exemplary embodiment of a light bulb adapter.
Figure 2A:
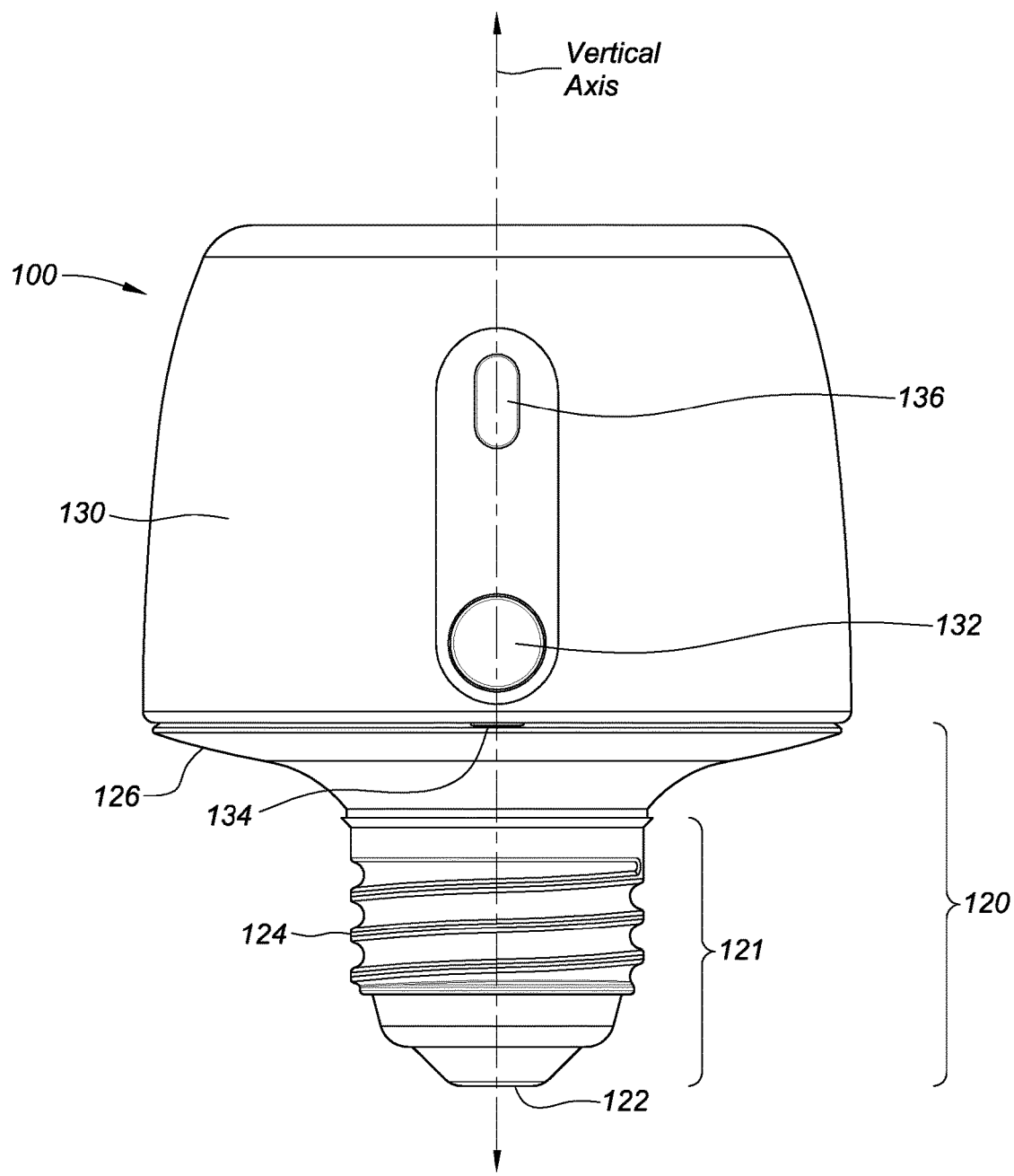
FIG. 2A is a front-side view of the light bulb adapter of FIG. 1.
Figure 2B:
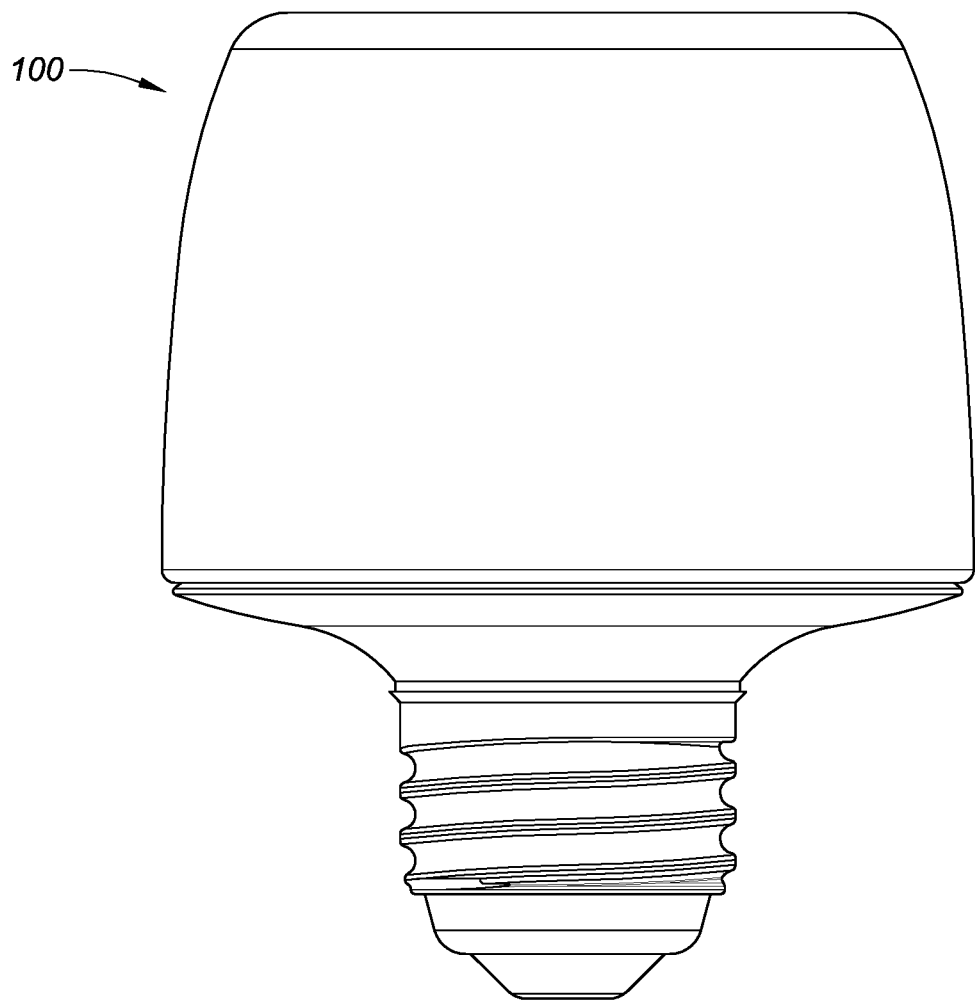
FIG. 2B is a left-side view of the light bulb adapter of FIG. 1.
Figure 2C:
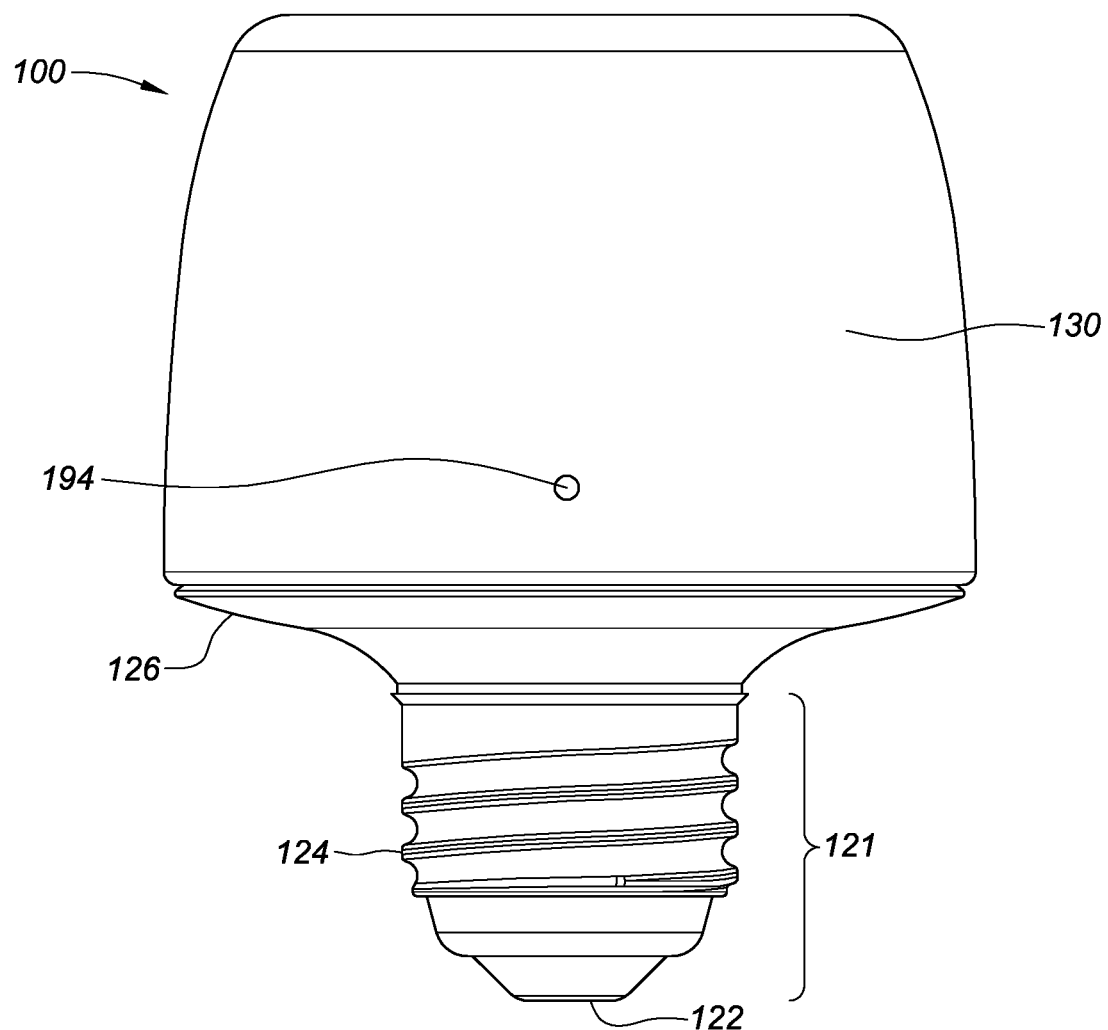
FIG. 2C is a rear-side view of the light bulb adapter of FIG. 1.
Figure 2D:
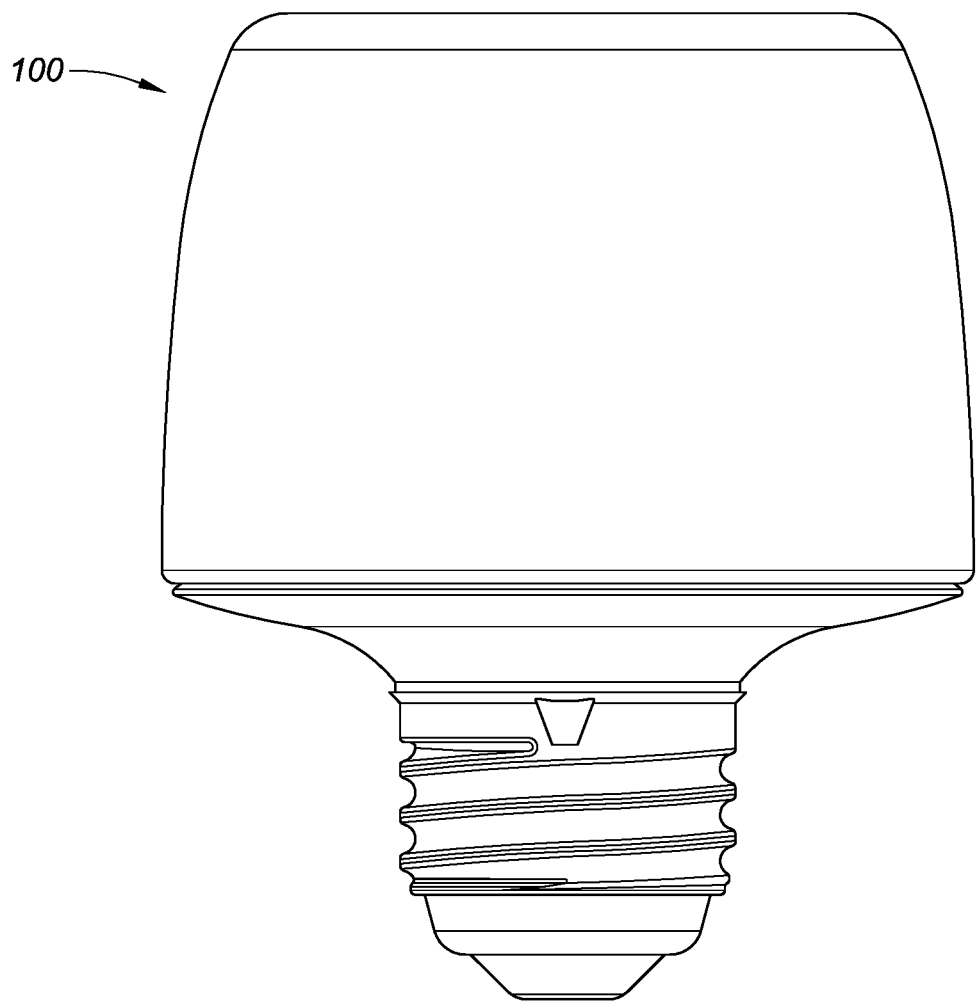
FIG. 2D is a right-side view of the light bulb adapter of FIG. 1.
Figure 2E:
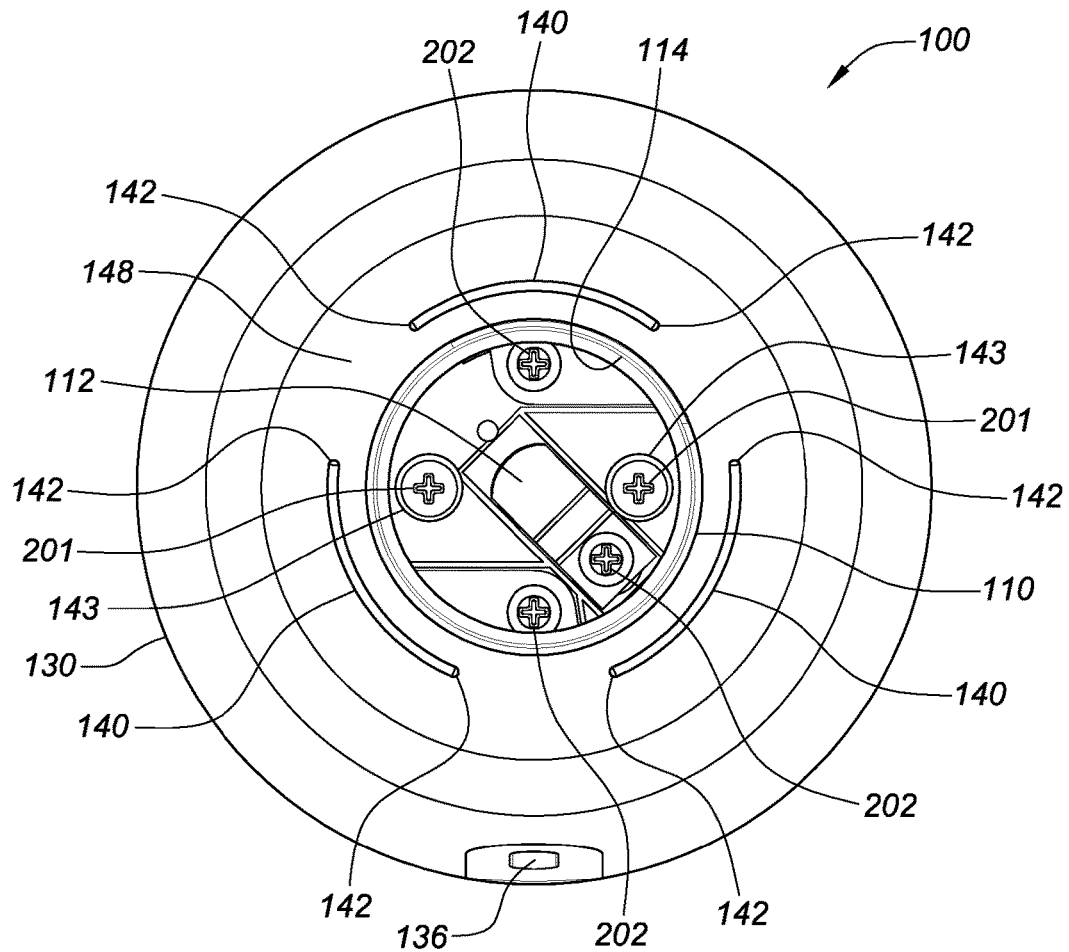
FIG. 2E is a top view of the light bulb adapter of FIG. 1.
Figure 2F:
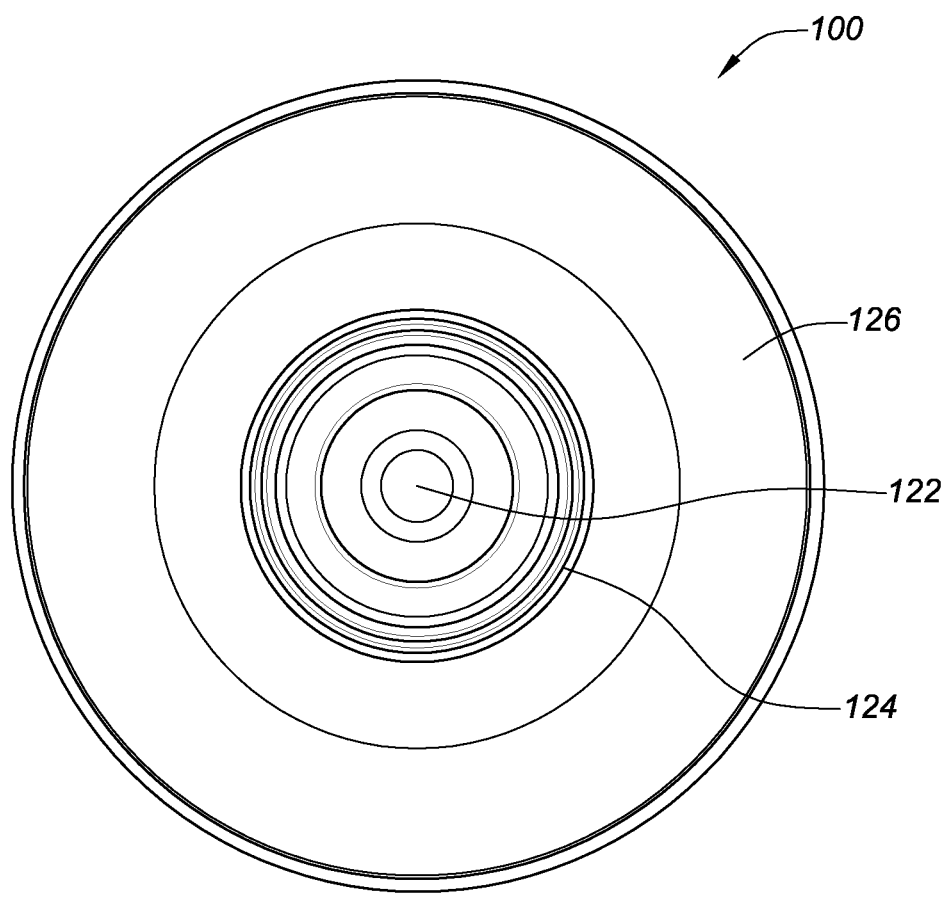
FIG. 2F is a bottom view of the light bulb adapter of FIG. 1.
Figure 3A:
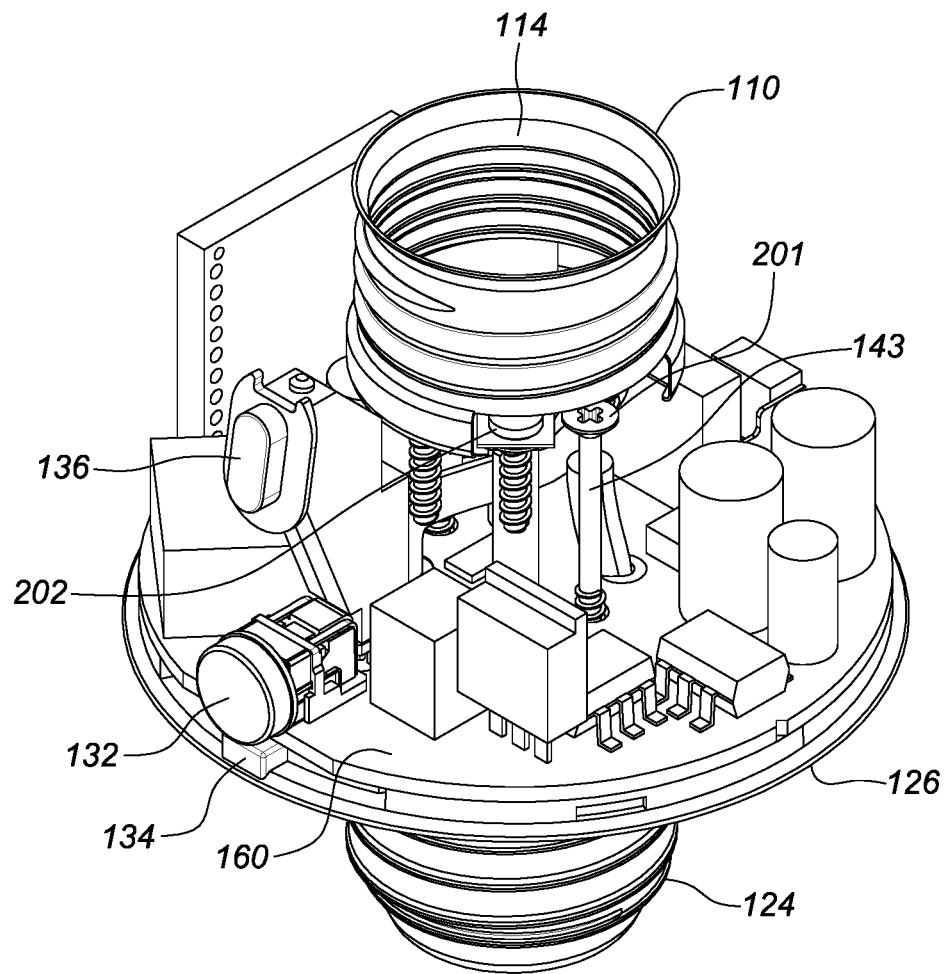
FIG. 3A is a perspective view of the light bulb adapter depicted in FIG. 1 with the top shell portion removed to show the bulb receptacle/socket components separated from the upper or top shell portion and the various electrical and mechanical structures and components contained within the main housing.
Figure 3B:
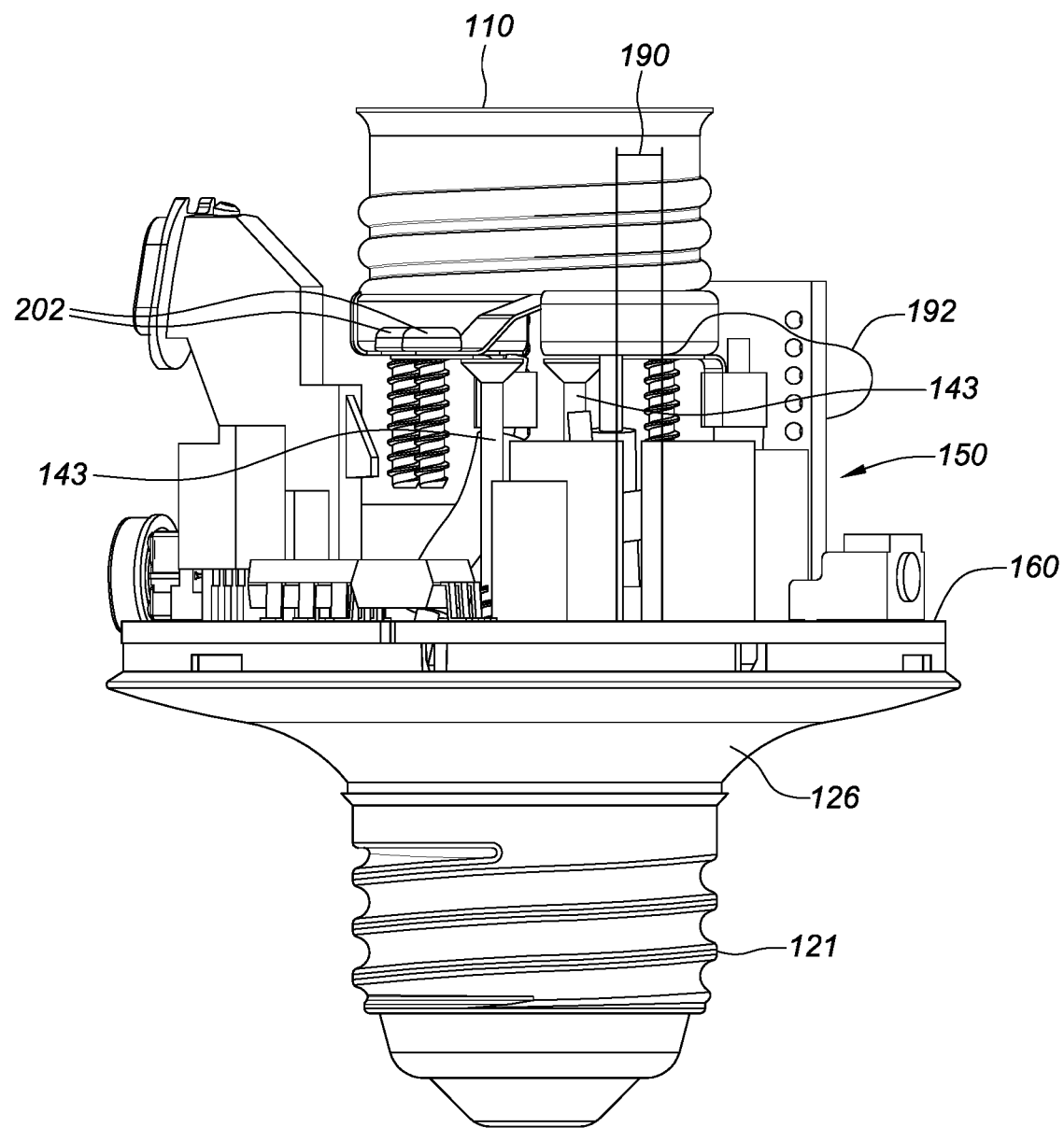
FIG. 3B is a right-side view of the light bulb adapter depicted in FIG. 3A to further illustrated the various electrical and mechanical structures and components of the adaptor including the position antenna elements.
Figure 4A:
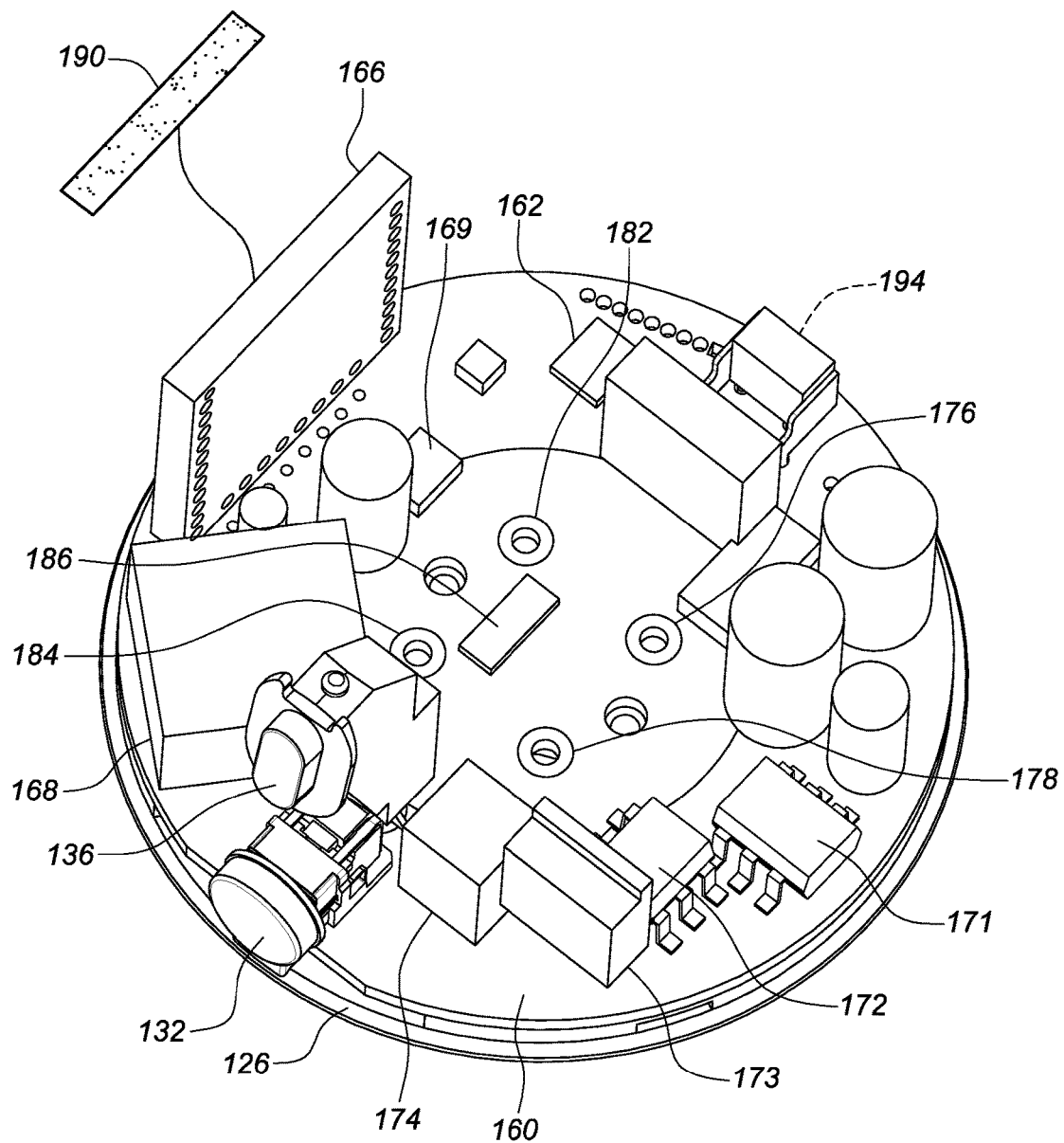
FIGS. 4A-4B are different perspective views of the light bulb adapter depicted in FIGS. 1-2F with the top shell portion and the light bulb receptacle/socket components also removed to further illustrate the various electrical and mechanical structures and components of the adaptor.
Figure 4B:
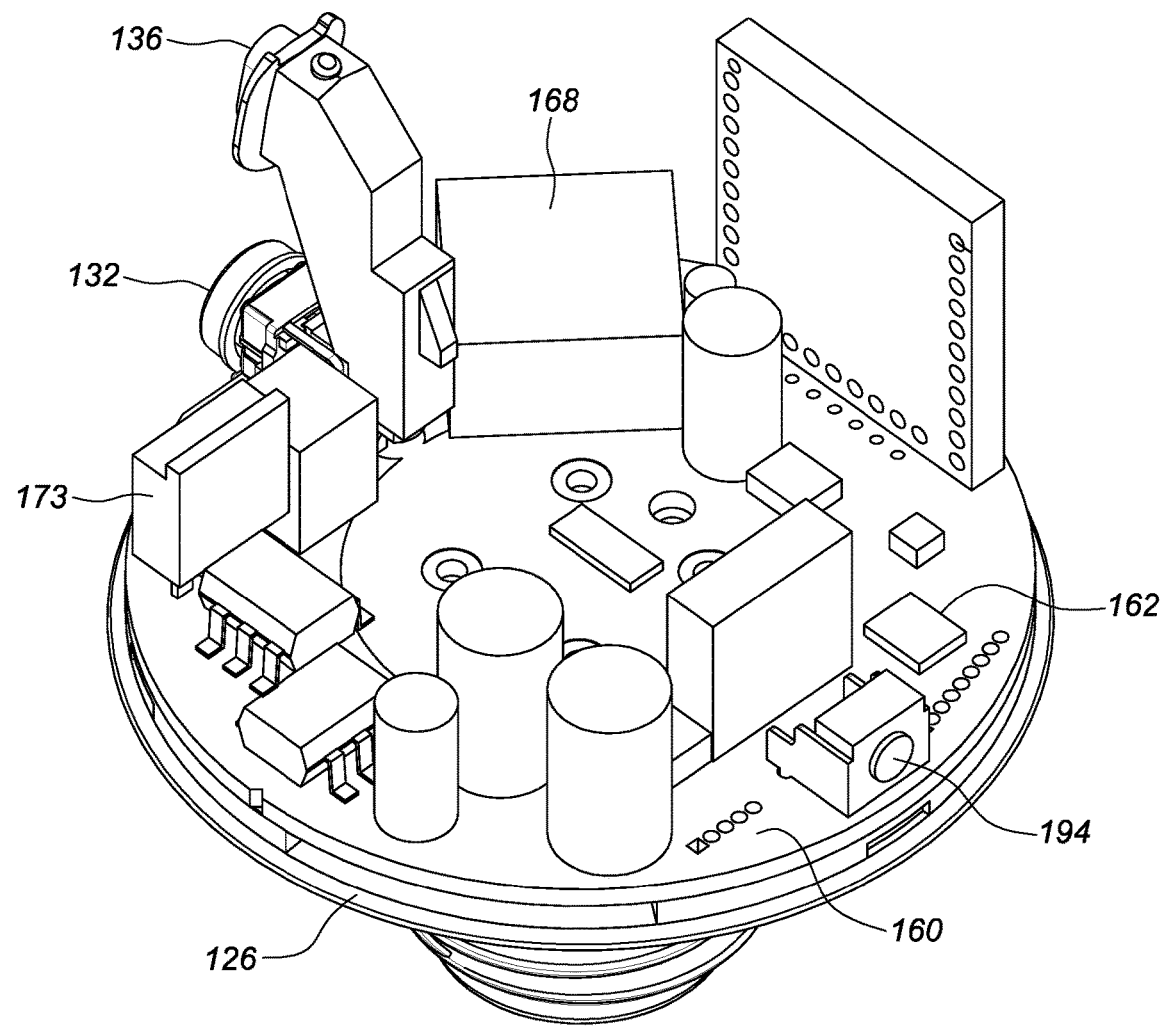

Illustrated in FIGS. 1-2F are the perspective, front-side, left-side, rear-side, right-side, top and bottom views, respectively, of a first exemplary embodiment of a light bulb adapter 100. FIG. 3A-3B are perspective and side views, respectively, of the light bulb adapter of FIGS. 1-2F with the top shell been removed to show the main housing and components. FIG. 4A-4B are additional perspective views of the light bulb adapter of FIGS. 1-2F with the top shell and the light bulb receptacle and associated components removed to further show components, configuration, and structure of the adaptor.

As shown in FIGS. 1-4B, the light bulb adapter 100 comprises a light bulb receptacle or socket 110, a light bulb base portion 120, an upper or top shell portion 130, and a main housing compartment 150 enclosed or defined by the base support structure 126 of the base 120 and the upper shell 130 portions. The base and upper portions 120, 130 are mechanically connected to one another via tabs or protrusions 131 that are spaced apart around the circumference of and extend from the bottom end region of the outer side wall 146 of the top shell portion 130 and engage or lock within slots 127 that are spaced apart around the circumference of and formed within the upper end region of the support structure 126 of the lower base 120 in locations that correspond to tabs protrusions 131 formed in the top shell portion 130. The top shell and lower base portions are connected to another by positioning the bottom end region of the top shell 130 onto the upper perimeter region of the support structure 126 of the base 120 and rotating the top shell 130 relative to the support structure 126 of the base 120 so that the tabs 131 are rotated into the slots 127 and the two components 120 and 130 interlock with one another.

A printed circuit board 160 containing various electronic components and circuitry resides on top of the base 120 support structure 126 with its underside supported thereby. To further secure the components into position screws 201 extending through sleeves 143 formed within the top shell 130 are secured within holes (having corresponding threads) formed with the upper region of the base 126. The sleeves 143 are dimension to extend and lay atop the upper side of the PCB 160 so as to sandwich the PCB 160 between the bottom end of the sleeves 143 and the region of the upper region of the support structure 126 that forms the threaded holes. The sleeves further serve to insulate the screws 201 (which may be metallic or formed out of non-conductive material) from the remaining electrical circuitry contained within the housing.

Engagement between the base support structure 126 and the top shell 130 can also be facilitated independently or in combination with the foregoing connection means by snap fit or other attaching mechanisms located for example at the perimeter interface regions between the two portions. The result is a multi-component housing configuration that is capable of facilitating ease of manufacture and assembly of the adaptor while also capable of elegantly and efficiently securing the external and internal components to one another in a durable manner by securing the components at both their outer perimeter as well as centrally at their inner core. Some implementations may only include one of the foregoing securing or attachment mechanisms or may include multiple or all of the foregoing securing or attachment mechanism either alone or in combination with other securing attachment mechanisms or means.

As best illustrated in FIG. 2E, the light bulb socket 110 includes a hot contact 112 and a neutral contact 114 and is threaded to engage with a correspondingly threaded light bulb base (not shown) that may be the same size or a different size or a different type from that of the light bulb base 120 of the adaptor 100. Thus, the adapter 100 may, for example, include a plug 121 that is adapted to being threaded into a light fixture socket that is configured to receive a different light bulb than the light bulb socket 110 of the adaptor 100. Alternatively, the adapter 100 may, as illustrated in the drawings, include a plug 121 having a hot contact 122 and a neutral contact 124 that is adapted to being threaded into a light fixture socket that is configured to receive the same light bulb as the light bulb socket 110 of the adaptor 100. The hot contact, neutral contact and threads are formed of conductive material (e.g., metal) to allow for the needed electrical conductivity to facilitate transmission of power to a light bulb secured within the socket 110.

The light bulb socket 110 and plug 121 may be a standard E26/27 medium socket and plug, respectively, that can be coaxially aligned with the light bulb receptacle 110 and threaded to engage with a lighting fixture or a conventional socket. Alternatively, the light bulb plug 121 may be a bi-pin socket and plug that is suitable for recessed lighting. It should be understood that other configurations of light bulb socket and plug can be used without deviation from the scope of this disclosure.

The light bulb socket 110 (or individual components thereof) is secured within the external cavity formed into the upper wall 148 of the top shell portion 130 via screws 202 that are secured to corresponding threaded holes in the lower wall 149 of the top shell portion 130 that forms the bottom of the light bulb socket cavity. The light bulb socket 110 is further supported by the surrounding inner side wall 144 of the top shell portion 130 that defines the light bulb socket cavity.

The base support structure 126 of the light bulb adapter base portion 120 extends axially towards the hot contact 122 of the base portion includes a threaded wall that is configured to engage with the threaded walls that form the neutral contact 124 of the base portion. The base support structure 126 as well as the top shell portion 130 are preferably made of an insulating or non-conducting material such as a rigid plastic with heat resistive properties suitable to resist damage from heat emitted from an operating light bulb contained and powered by the adapter.

FIGS. 5A through 6B provide cross-sectional and more detailed views that illustrate the and base and shell structure and internal components housed therein. The inner side wall 144, an outer side wall 146, an upper wall 148 and a lower wall 149 together with the securing screws and mechanisms previously described are particularly well illustrated in those drawing.

Figure 5A:
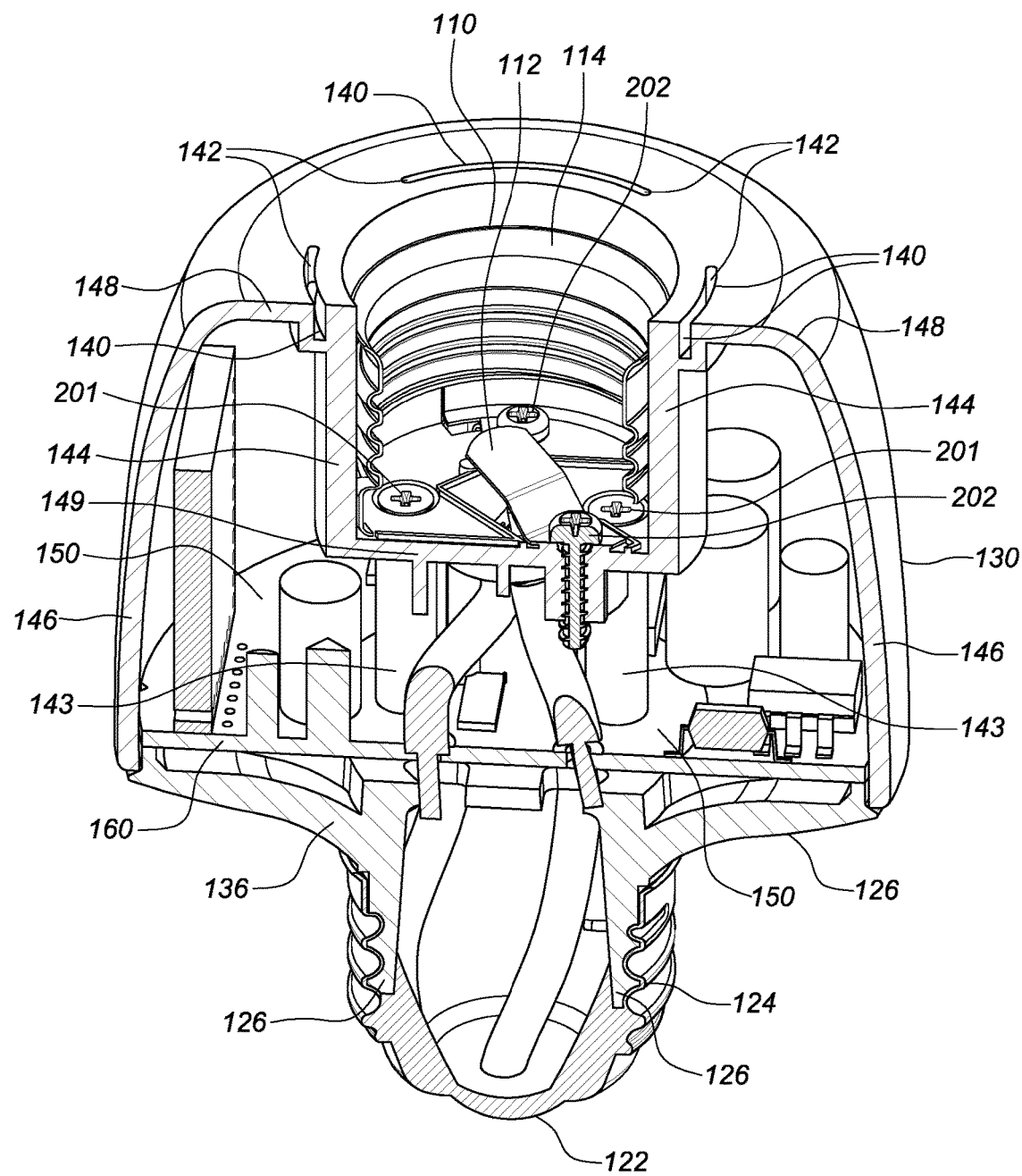
FIG. 5A is a cross-sectional view taken along 5A-5A of FIG. 1 to further illustrate the structure and components of the adaptor and the electrical connection between the receptacle/socket (contained within the top shell portion) and the printed circuit board ("PCB") secured within the primary housing that includes other electrical components and circuitry. It also further illustrates in greater detail the electrical wires that connect the contacts of the screw-in light bulb plug supported at the lower end region of the base portion and the PCB as well as the vent hole 142 trenches 140 and the mechanical connection and attachment between the top shell and base and the PCB contained therein.
Figure 5B:
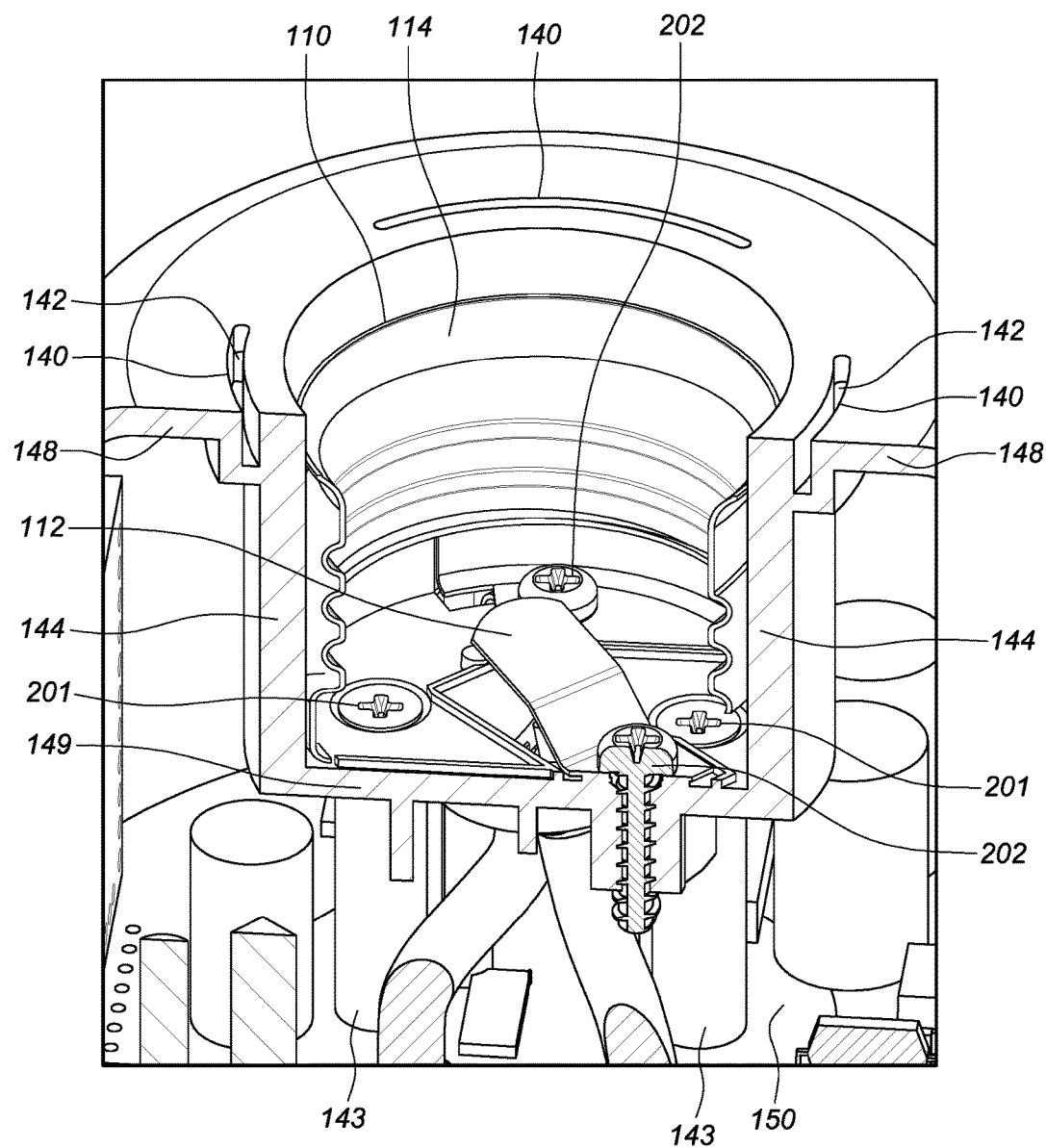
FIG. 5B is an enlarged view of a portion of FIG. 5A to further illustrate in more detail the light bulb receptacle/socket and the upper portion of the top shell including the vent trenches formed therein.
Figure 6A:
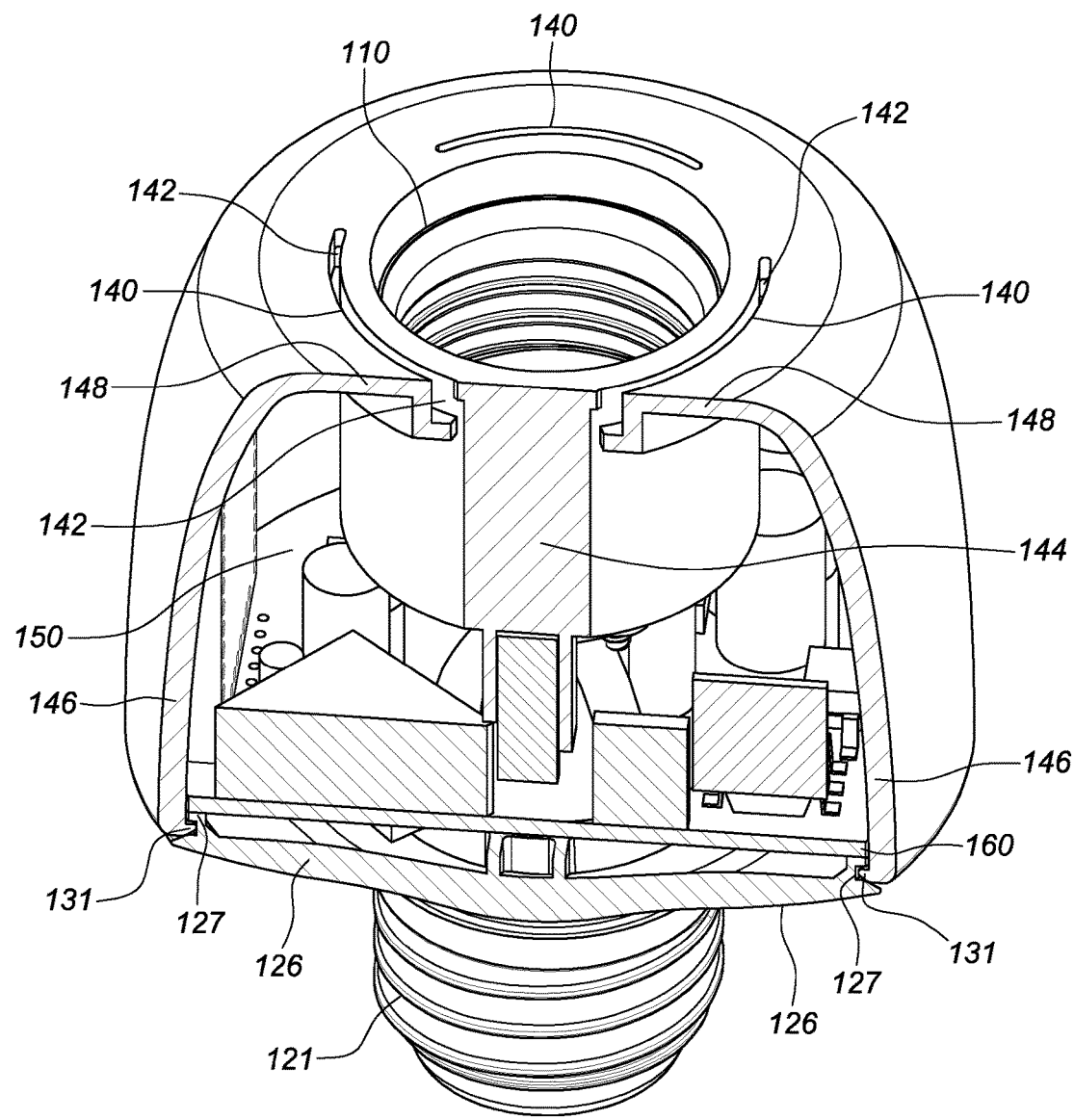
FIG. 6A is another cross-sectional view to further illustrated the structure, configuration and components of the adaptor. The view is taken along 6A-6A of FIG. 1, which is further out from the vertical axis of the adaptor, around which the adaptor is symmetrically externally configured.
Figure 6B:
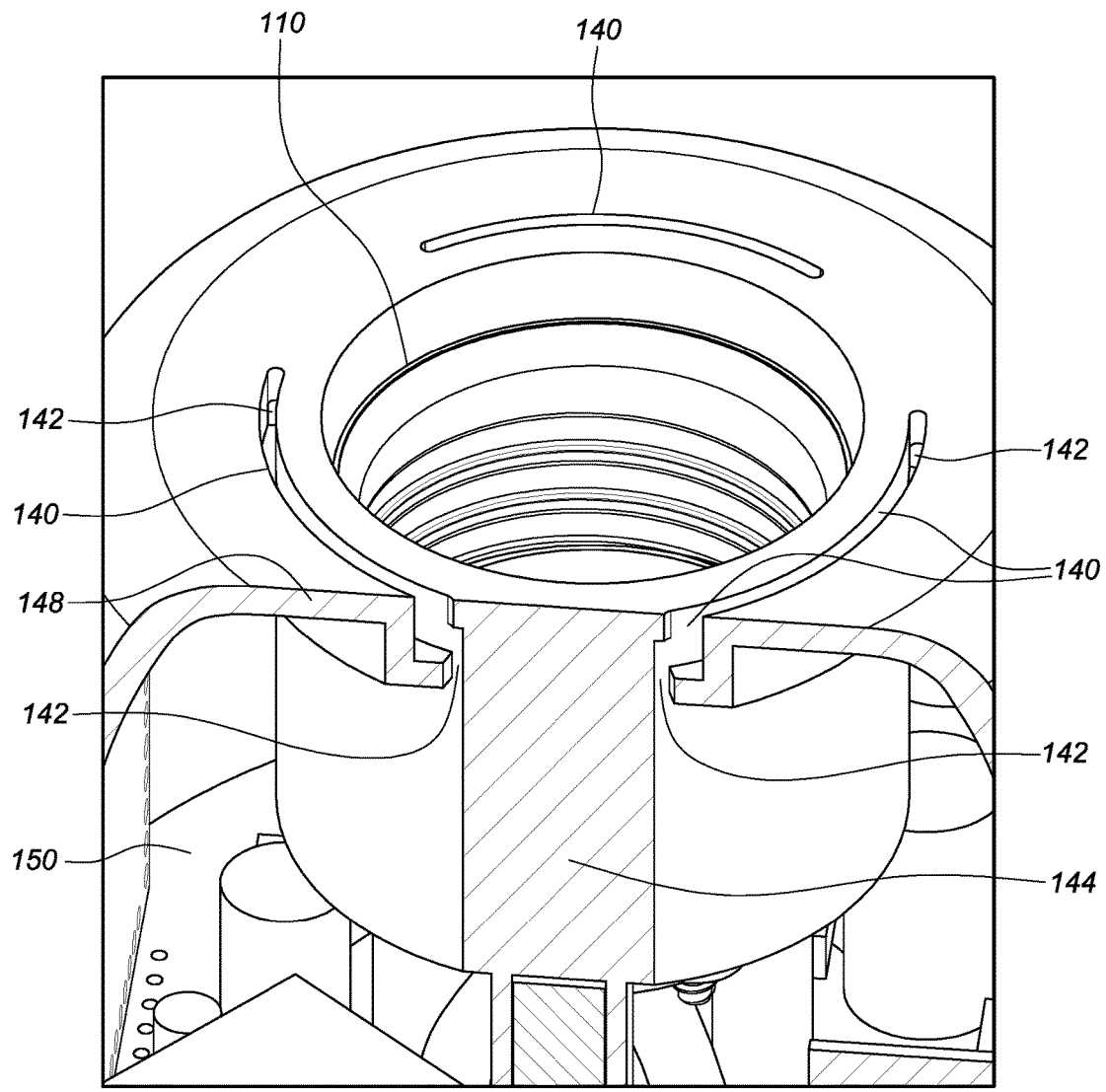
FIG. 6B is an enlarged view of a portion of FIG. 6A to further illustrate in more detail construction of the top shell.

The enlarged views illustrated in FIGS. 5B and 6B also provide particularly good cross-sectional views of the trenches 140 and vent holes 142 that are provided on the upper wall 148 of the shell 130. As best shown in FIG. 6B, vents or vent holes 142 are included at both ends of the three trenches 140 illustrated. The vents 142 can provide pathways for air circulation to dissipate heat in the main housing 150 generated by the electronic components or from heat radiating from the operation of the light bulb connected within the light bulb receptacle 110.

Although the vents 142 as illustrated are provided at the ends of the trenches 140, it is understood that the vents 142 can be provided at any place along the trenches 140 including on the side walls that form the trenches so that they are elevated above the bottom the trench 140. In one embodiment, the vents 142 are provided at the center and the ends of the trenches 140. In another embodiment, the length of the trenches 140 themselves are formed as open as vents. It is also understood that the vents 142 can be provided at any place on the upper wall 148 of the shell 130. In one embodiment, the vents 142 are provided on the upper wall 148 where there is no trenches. It is also understood that the vents 142 can be provided at any place of the shell 130. In one embodiment, the vents 142 are provided on the outer side wall 146 of the shell 130. Yet in another embodiment, the vents 142 are provided on the base 126. It is understood that the vents 142 can be provided at any location described above or in any combination thereof. The trenches can provide additional protection to the circuitry contained within the adaptor 100. For example liquid or other particulate matter may be trapped or captured by the vents and thereby precluded from entering the adaptor housing and damages the circuitry contained therein. The surfaces of the trenches may be engineered to assist in this process by including additional cavities and other mechanical barriers.

The main housing 150 can also be configured to thermally shield the electronic circuit components therein from absorbing excessive heat from the light bulb that is connected to the light bulb receptacle 110. Examples of thermal shield include, but not limited to, dissipation, reflection or simply absorption of the heat. Thus, for example the upper wall 148 of the shell 130 may be formed of white color or a reflective material to mitigate heat absorption by reflecting the light emitted by a light bulb operating in the adaptor 100 away from the adaptor 100. The thermal shield may be formed by the upper wall 148 of the shell 130 itself or via a coating or overlay on top of the upper wall 148.

As best shown in FIGS. 3A-4B, the main housing 150 defined by the inner surfaces of the base support structure 126 and top shell portions 130 includes the PCB 160, which contains the electronic circuits and components mounted thereon. The block diagrams of FIGS. 10A and 10B provide representative implementations of the circuitry and components that may be employed in the adaptor 100.

Figure 10A:
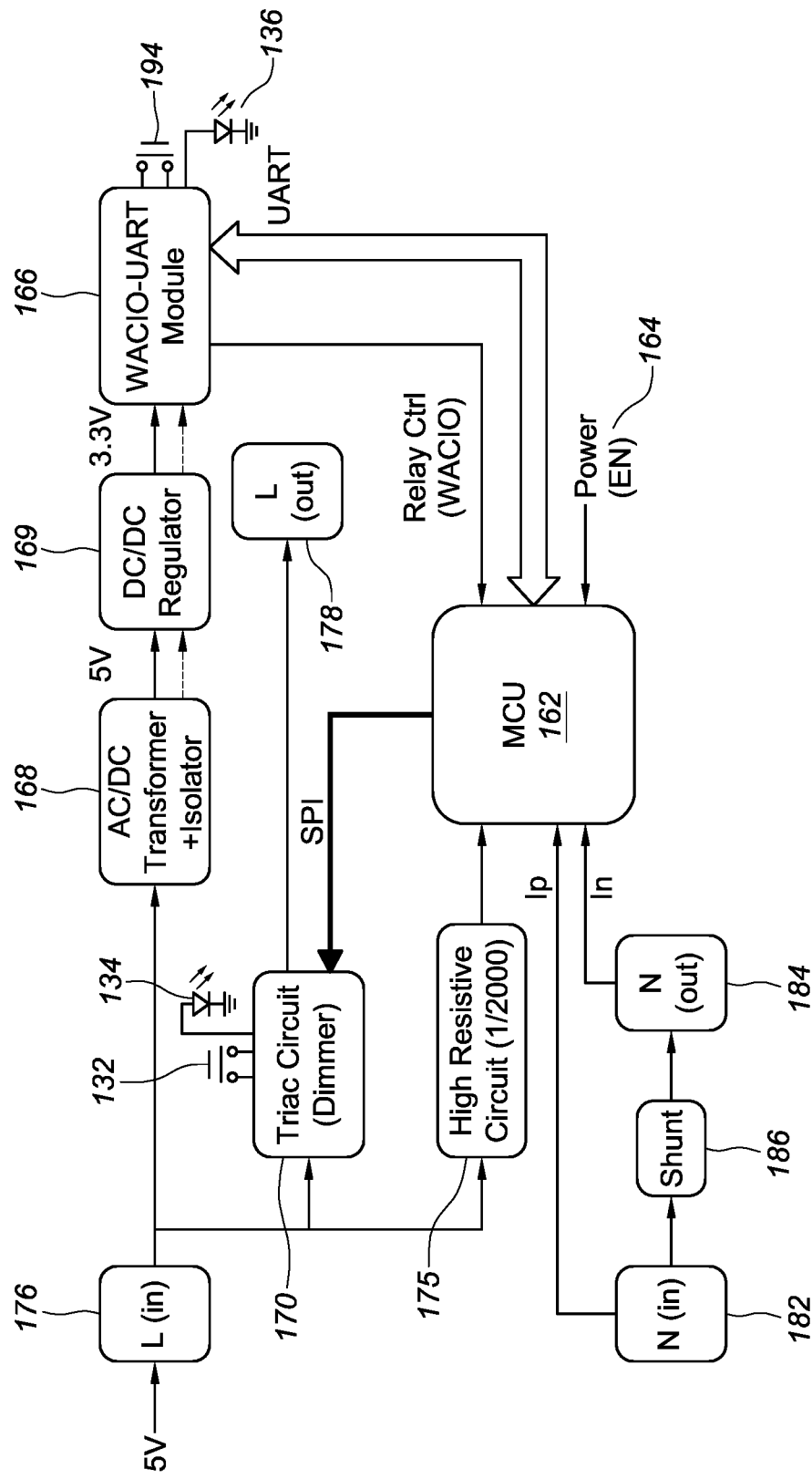
FIG. 10A shows a circuit block diagram of an exemplary implementation of the electronic circuits and components of the light bulb adapter of FIGS. 1-6B or the light bulb adapter of FIGS. 7-9.
Figure 10B:
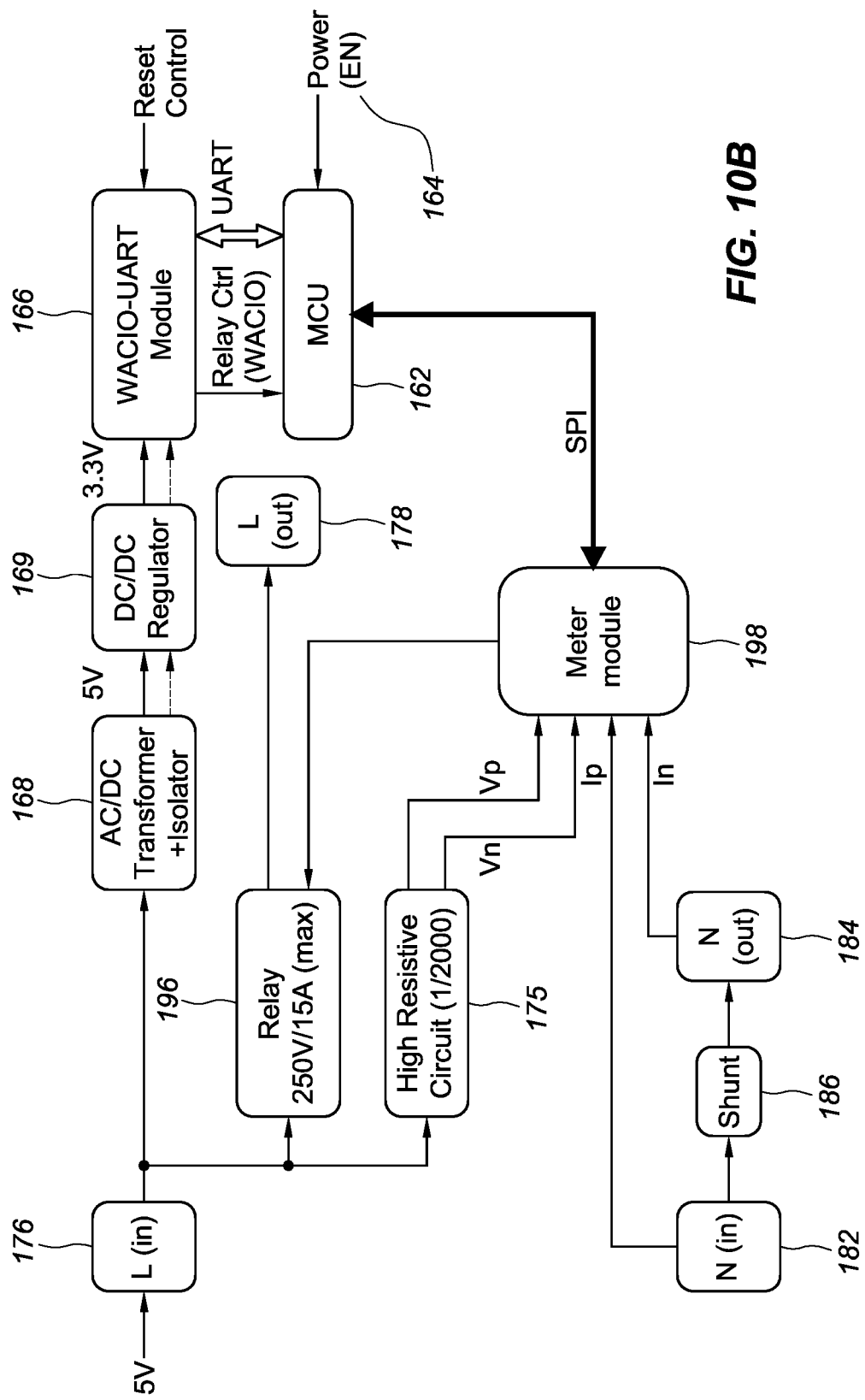
FIG. 10B shows a circuit block diagram of another exemplary implementation of the electronic circuits and components of the light bulb adapter of FIGS. 1-6B or the light bulb adapter of FIGS. 7-9.

With reference to FIG. 10A, the electronic circuits/components may comprise a MCU (microcontroller unit) module 162, a WACIO/UART (wide area communications IO/universal asynchronous receiver and transmitter) module 166, a Triac circuit 170, and other circuit components, such as an AD/DC converter/transformer and isolator 168, a DC/DC regulator 169, a high resistant circuit 175, an input circuitry and an output circuitry, etc. further described in additional detail below.

As shown in FIG. 10A, the hot input L(in) 176 and neutral input N(in) 182 are electrically connected to the hot contact 122 and neutral contact 124, respectively, of the plug 121. The hot output L(out) 178 and neutral output N(out) 184 are electrically connected to the hot contact 112 and neutral contact 114, respectively, of the light bulb receptacle 110. A shunt 186 is provided between the neutral input N(in) 182 and the neutral output N(out) 184 to provide a low resistance path.

The MCU module 162 may serve as the main processor of the light bulb adapter 100 to perform system control and processing. The MCU 162 includes a sleep mode to turn off power after a predetermined time period of inactiveness and thereby may save power when the adapter is inadvertently left on for extended periods of time. When the WACIO/UART module 166 receives a command (e.g., over WiFi or otherwise), for example, to turn the light on, the MCU 162 is awaken by the Power (EN) signal 164.

The WACIO/UART module 166 is configured to establish connection to local area network (LAN), manage wireless local area network connection, and perform security encryption. The WACIO/UART module 166 may link, for example, to a wireless local area network via a protocol, such as the WAC and/or HomeKit from Apple. (HomeKit and Apple are trademarks of Apple Inc.) HomeKit is Apple's home automation framework, introduced with operating system iOS 8, for developers for integrating home automation control applications into the iPhone/iPad/iPod, etc. (iOS is a trademark of Cisco Systems, Inc.; iPhone, iPad and iPod are trademarks of Apple Inc.)

The Triac circuit 170 may receive commands from the MCU 162 and subsequently the WACIO/UART module and pass energy from the input, L(in) 176, to the output, L(out) 178, accordingly. In addition, the Triac circuit 170 can also turn the output on/off and/or dim the output and thereby serve as a dimmer circuit. In addition, the Triac circuit 170 may monitor and report the amount of energy that is consumed by the light bulb through power transmitted thereto via the adaptor 100 when the light bulb is connected to the light bulb receptacle 110. The Triac circuit 170 can be constructed with an OP amplifier 171, a Triac driver 172, a Triac (triode for alternating current) 173, and a capacitor 174 as known by those skilled in the art.

The AD/DC converter 168 can convert step input power, for example, 90-240 V AC to a level that is usable by the WACIO/UART module 166 at, for example, 3.3 V DC.

An exemplary placement of the modules/components is best shown in FIG. 4A. An exemplary interconnection between modules or circuitry elements are illustratively shown in FIG. 10A. The components are strategically compactly positioned to minimize the overall size of the light bulb adapter 100 so at to minimize interference while maintaining the compatibility with existing and legacy lighting fixtures.

The electronic circuits described herein allow the user to control the light bulb that is connected to the light bulb adapter 100 by using an accessory protocol, for example, Apple's HomeKit application that is installed in a mobile device.

A manual bypass switch or button 132 which also connected to the PCB and accessibly mounted externally on the shell 130 to allow the user to manually control whether to bypass the application. When bypassed, the light bulb adapter 100 functions to convey power to the light bulb received from the power source connected to the plug 121 that is connected to a lighting fixture socket. An LED 134 is included within the bypass switch/button 132 to illuminate the switch/button and provide indication of the bypass status.

A WiFi indicator LED 136 can also be externally visibly surface mounted to the shell 130 to provide the network status. For example, when the LED 136 is blinking in a faster frequency, it indicates that it is in paring or discovering mode, while the LED 136 is blinking in a slower frequency, it indicates that the light bulb adapter 100 has been added to the network. It can also be used to indicate whether a light bulb is plugged into the light bulb receptacle 110. While the LED 136 is illustrated as a separate indicator from LED 134 of the bypass switch/button 132, it should that the LED indicator components could be combined and the meaning of indications distinguished either by differing color or differing emission frequency or both.

A reset button 194 also electrically attached to the PCB and mounted for user accessibility (e.g., through a pin hole in the shell 120) is included to provide a mechanism for the user to reset the light bulb adapter 100 to a default status.

An antenna 190 and associated antenna cable 192, such as that suitable for WiFi (or other wireless local area networks) can be placed in the main housing 150 or at the outer portion of the main housing to facilitate the communications between light bulb adapter 100 and the user via an accessory protocol, for example, iOS and the HomeKit application. The antenna 190 can be configured to ensure efficient signal propagation, and to ensure the signal is not affected by heat generated from light bulb that is plugged into the light bulb adapter 100.

To ensure efficient signal propagation and connectivity the antenna is positioned on the perimeter region of the main housing 150 and preferably away from to the extent possible for the high power in line (L (in)) and perhaps shielded therefrom. It may also be mounted onto the inner surface and/or outer surface of the housing and/or embedded into the housing directly at one or more regions thereof (e.g., upper or lower regions of shell 130 and/or base support structure 126). Thus, in a preferred implementation the antenna is connected to the outwardly facing surface of the WACIO-UART Module 166, which is in the shape of a panel and is mounted on end to the PCB board. The antenna 190 can be connected to the module 166 via a co-axial cable and attached or incorporated into an adhesive substrate that can be adhesively attached to the inner surface of the shell 130, for example, on the inner surface of the outer side wall 146. The WACIO-UART Module 166 not only connects the antenna 190 to the functional control circuitry contained on and in the PCB but also may serve as a shield protecting the antenna 190 from undesired interference.

In manufacture, the assembled PCB board 160 and components thereof are preferably positioned onto the upper support platform of base support structure 126, the antenna 190 is then positioned and secured to the inner surface of the outer side wall 146 via the adhesive substrate (see also FIG. 4A). The other externally mounted components can be positioned relative to the shell 130 to align with or within the corresponding windows and holes in the shell 130. The shell 130 can then be secured to the base support structure 126 over the PCB 160 and secured or mounted to one another as previously described above with the interlocking tabs and groove/slots 131, 127 and screws 201. The light bulb receptacle/socket 110 components 112 and 114 can be secured within the socket cavity (defined by the lower and inner side walls 139 and 144) extending into the upper wall 148 the shell 130 as previously described with the screws 202 either before and/or after securing the top shell 130 to the base support structure 126. The hot and neutral contacts 122, 124 of the plug can be screwed onto the threaded region of the lower end region base support structure 126 as previously described either before or after securing the top shell 130 to the base support structure 126. The wires connecting the hot and neutral contacts 112, 122 and 114, 124 connect those elements to the PCB 160.

The circuitry of the adaptor 100 is powered by the existing power source to the light fixture.

In the present embodiment, the electrical components are strategically positioned to avoid electrical interference. For example, high power components (e.g., input L(in) 176, output L(out) 178) are positioned near the central area on PCB 160 while low power components (e.g., MCU 162) are positioned away from the central area on PCB 160, in addition to provide compactness to the light bulb adapter 100 in overall size.

Figure 7:
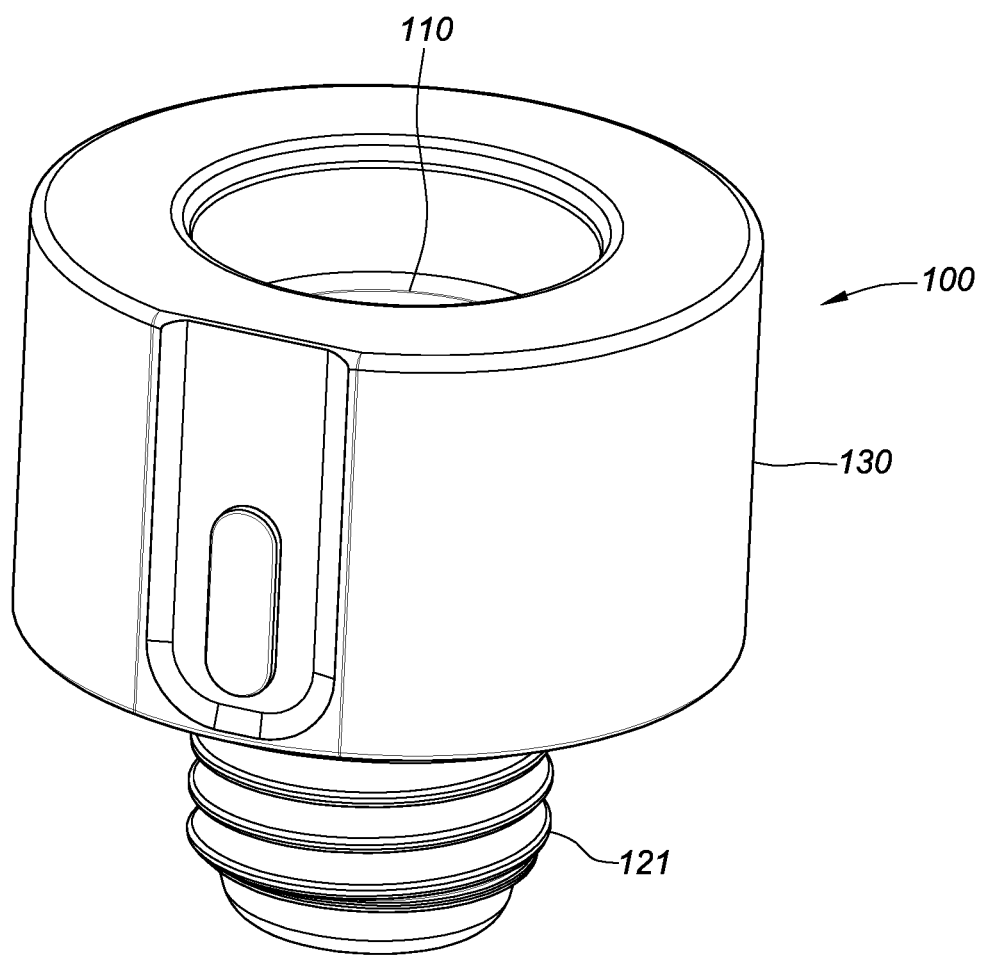
FIG. 7 is a perspective view of another embodiment of a light bulb adapter that includes a more cylindrically shaped top shell configuration but otherwise may include the same components and structure as the prior embodiment.
Figure 8:
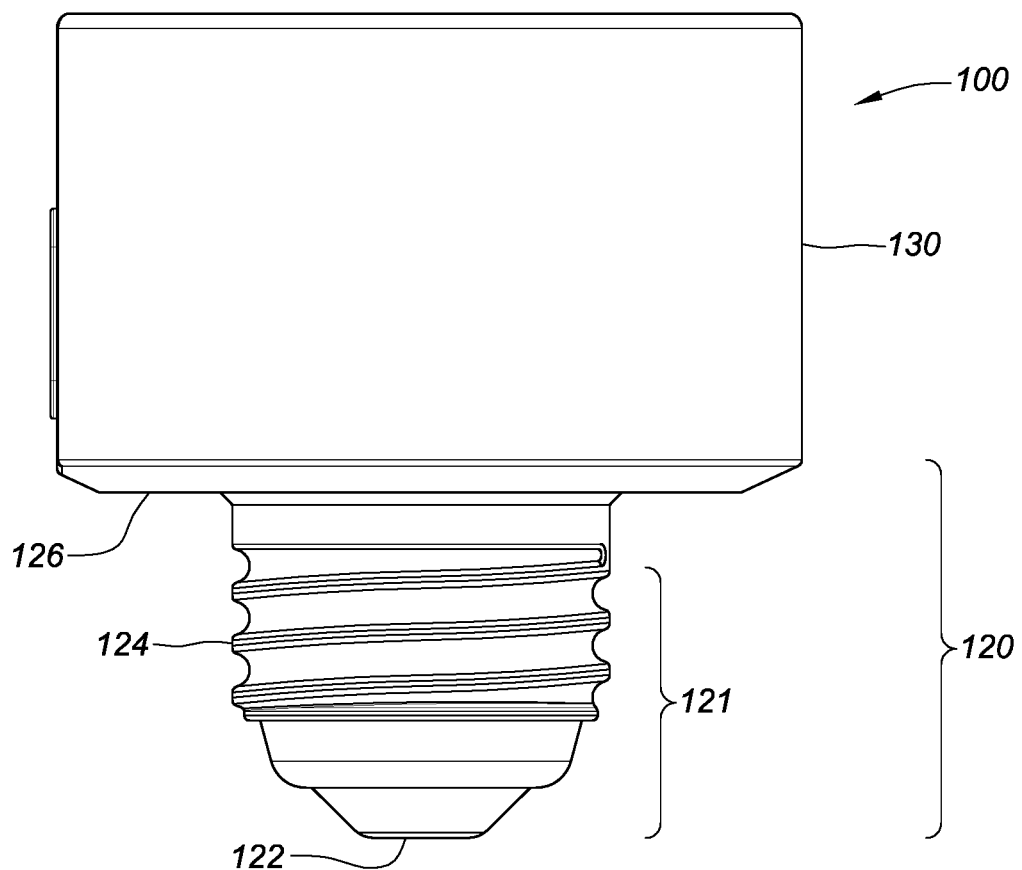
FIG. 8 is a front view of the light bulb adapter depicted in FIG. 7.
Figure 9:
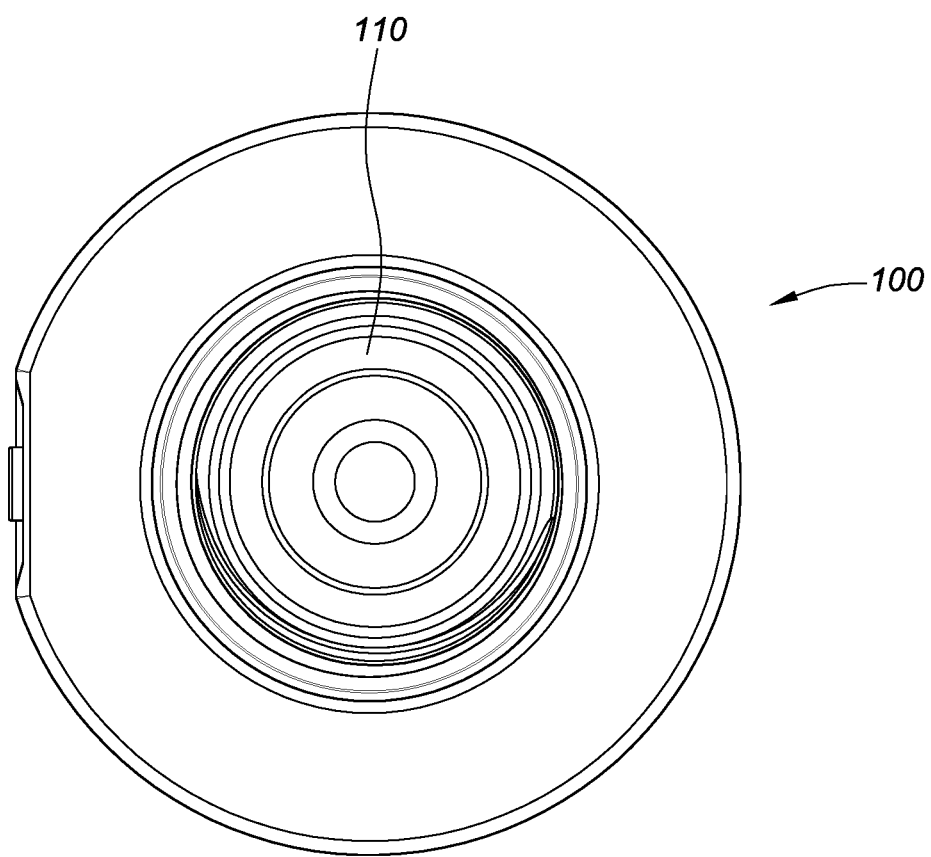
FIG. 9 is a top view of the light bulb adapter depicted in FIG. 7.

FIG. 10B shows another circuit block diagram of exemplary electronic circuits built into the light bulb adapter of FIGS. 1-6B or the light bulb adapter of FIGS. 7-9. The components shown in FIG. 10B largely correspond to those described above in connection with FIG. 10A. The circuitry described in FIG. 10B, however, employs a meter module 198 and relay 196 to perform similar function as that of the Triac circuit 170 of the circuit described in connection with FIG. 10A.

An application software that is installed in a mobile device can be provided to the user to further effectuate the control and to allow the user to schedule events (tasks) for the connected light bulb. For example, the user can set an event that turns the light bulb on every Monday evening at 6:00 PM. Furthermore, the application may allow the user to assign "rooms" and "zones" where one or more light bulb adapters are located.

Generally, in operation, the user unplugs a light bulb from a lighting fixture and plugs or threads in the light bulb plug 121 of the adapter 100 into the lighting fixture. The user then plugs in the light bulb or a different light bulb into the light bulb receptacle 110 of the adapter 100. The user connect his/her mobile device, such as a smart phone to tablet computer, to the electronic circuits built in the light bulb adapter 100 over a wireless local area network, such as WiFi, via an accessory protocol, for example, Apple's HomeKit with iOS 8. Once connected the user is able to control the light bulb adapter 100, and subsequently the light bulb connected to it, using the accessory protocol.

Figure 11A:
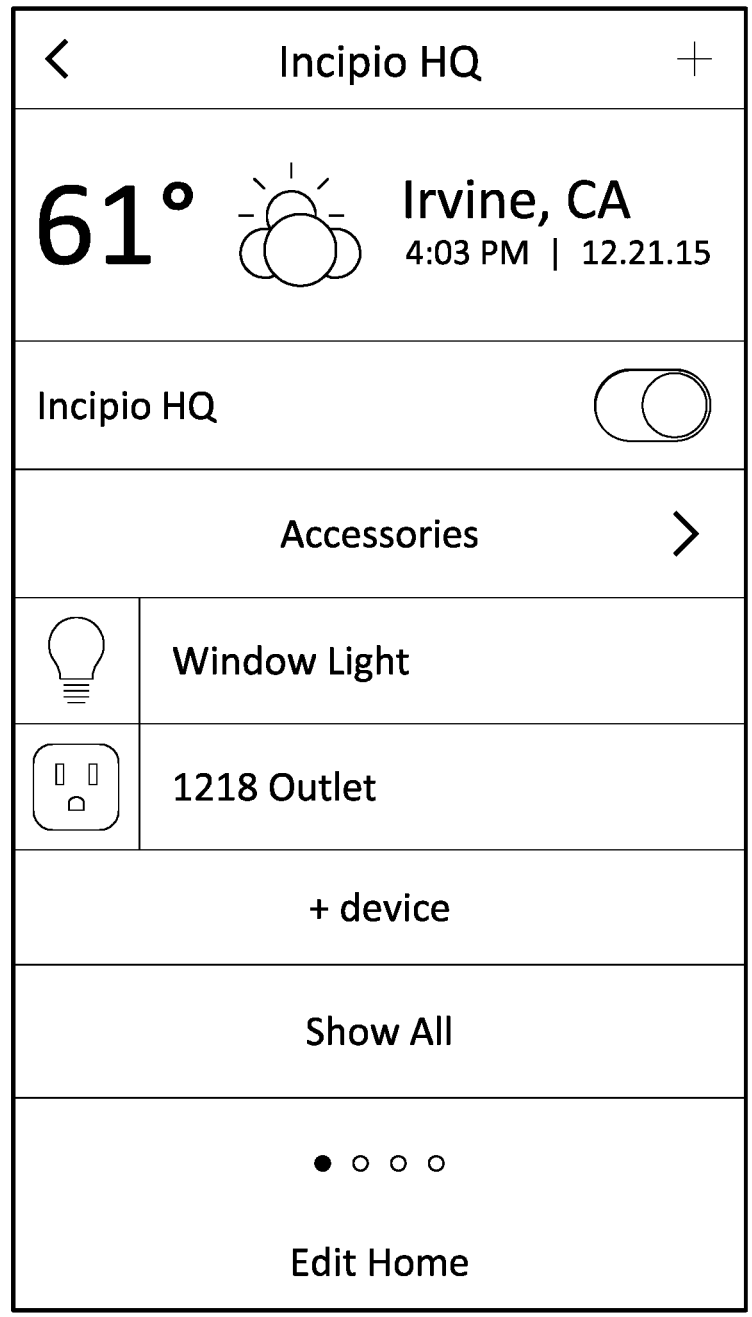
FIGS. 11A-11D shows exemplary screen shots from a mobile device installed with software application for the light bulb adapter of FIGS. 1-6B or the light bulb adapter of FIGS. 7-9.

The application software can be configured to allow the user to assign a location, home, etc., to the light bulb adapter 100. In addition, the application software can be configured to allow the user to assign the light bulb adapter 100 to a room within the home. In addition, the application software can be configured to allow the user to set schedules, for example, when the light bulb adapter 100 is to turns the light bulb on/off and for what duration of time. FIG. 11A shows an exemplary screen shot taken from the screen of a mobile device installed with the application software where a light bulb adapter is assigned a name Window Light.

Through the accessory protocol, the user is able to command the light bulb adapter 100 to control the function of the light bulb adapter 100. In one embodiment, the user is able to command the light bulb adapter 100 by using a voice recognition software application, for example, Apple's Siri to control the function of the light bulb adapter 100. (Siri is a trademark of Apple Inc.) For example, the user can command Siri to turn the Window Light of FIG. 11A on by commanding "Siri, turn the Window Light on."

Figure 11B:
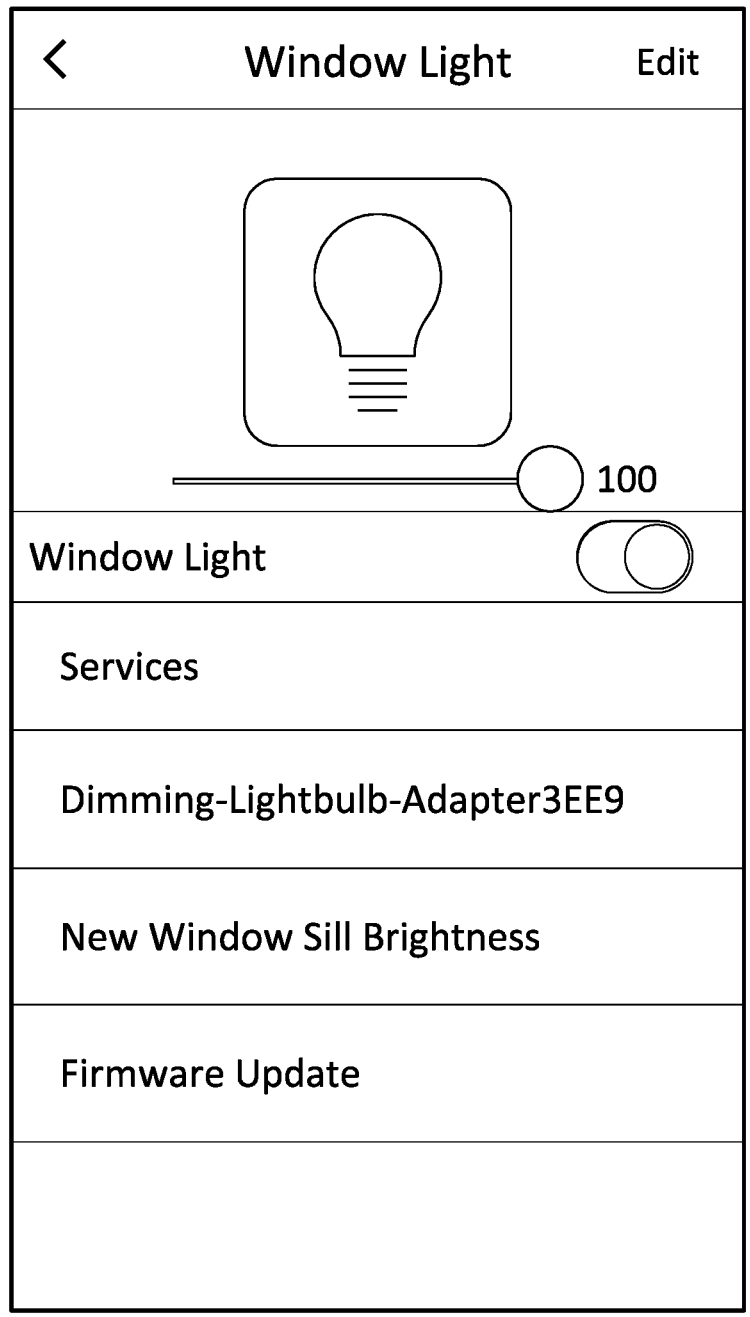

In one embodiment, the user is able to command the light bulb adapter 100 to turn the light bulb plugged into the light bulb adapter 100 on/off. In one embodiment, when a compatible light bulb is connected to the light bulb adapter 100, the user is able to control the intensity (i.e., dimming) of the light bulb by controlling the amount of power the adapter 100 conveys to the light bulb. As shown in the exemplary screen shot of FIG. 11B, where the adapter conveys 100% of power to the light bulb.

Figure 11C:
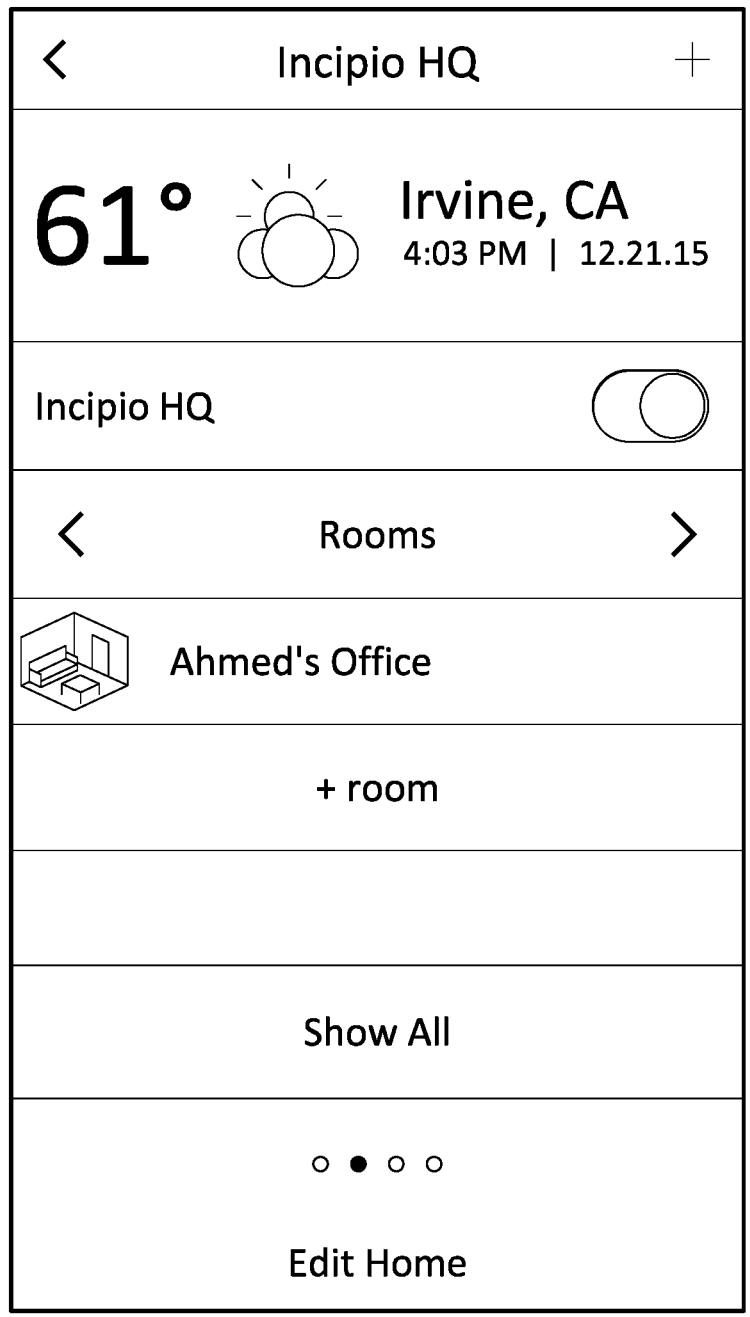
Figure 11D:
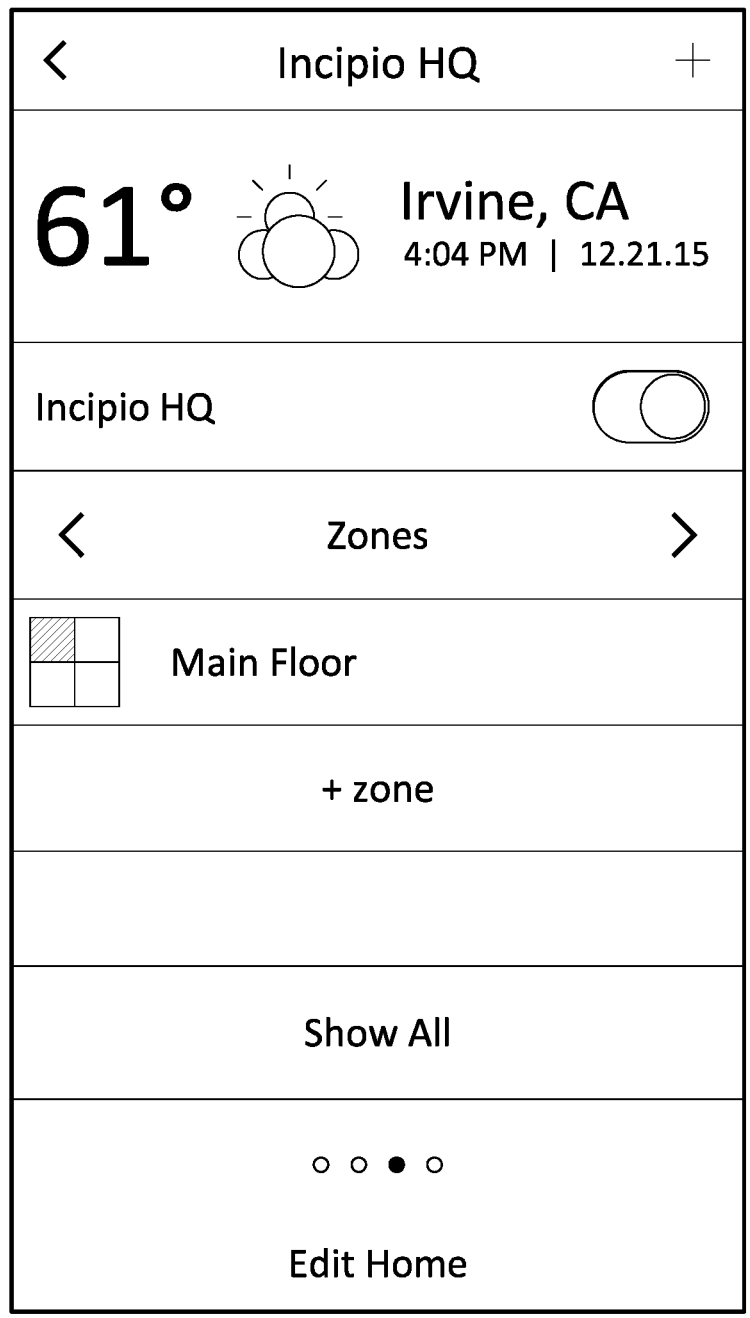

Multiple adapters may be employed and controlled in a single residences or place of business or even in a single room. Thus, the user is able to control one or multiple adapters through the accessory protocol application, for example, HomeKit application with iOS. FIG. 11C shows an exemplary screen shot taken from the screen of a mobile device installed with the application software where the user can see a list of rooms he/she created in his or her home, Ahmed's office in this example. From this view, the user can edit room attributes by selecting the room from the list. FIG. 11D shows an exemplary screen shot taken from the screen of a mobile device installed with the application software where zone view is shown. Users can group rooms together into a zone, Main Floor, in this example. From this view, the user is able to edit a Zone's attributes by selecting the desired zone from the list.

The embodiments illustrated in FIGS. 1-11D and the methods of use described herein provide unique solutions that are capable of allowing a user to transform a light fixture, into which this adapter 100 and a light bulb are affixed, into a remotely controlled fixture that is compatible to an accessory protocol such as Apple's HomeKit and controlled through remotely wirelessly via WiFi.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

Similarly, this method of disclosure, is not to be interpreted as reflecting an intention that any claim require more features than are expressly recited in that claim. Rather, as the following claims reflect, inventive aspects lie in a combination of fewer than all features of any single foregoing disclosed embodiment. Thus, the claims following the Detailed Description are hereby expressly incorporated into this Detailed Description, with each claim standing on its own as a separate embodiment.

What is claimed is:

1. A light bulb adapter comprising:
a light bulb receptacle configured to receive a light bulb;
a light bulb plug configured to connect to a lighting fixture;
a shell having an outer side wall, an upper wall, an inner side wall and a lower wall, the inner side wall and the lower wall are configured to surround and support the light bulb receptacle;
a base configured to engage with the perimeter region of the outer wall of the shell to form a main housing, wherein the main housing that encloses electronic circuits are configured to wirelessly receive commands over WiFi from a mobile electronic device to control the function of the light bulb adapter; and
plurality of vents, wherein the light bulb adapter further comprises a trench having two ends and a center portion in between the ends, wherein the trench is opened at the upper wall, and wherein at least one of the plurality of vents is located at one of the two ends of the trench.

2. The light bulb adapter of claim 1, wherein the electronic circuits comprise a MCU (microcontroller unit) module, a WACIO/UART (wide area communications IO/universal asynchronous receiver and transmitter) module, and a meter module.

3. The light bulb adapter of claim 2, wherein the WACIO/UART module establishes connection to local area network (LAN), manages wireless local area network connection, and performs security encryption.

4. The light bulb adapter of claim 2, wherein the meter module monitors and reports the amount of energy that is consumed by the light bulb that is connected to the light bulb receptacle.

5. The light bulb adapter of claim 1, wherein the light bulb adapter further comprises an antenna for receiving the commands.

6. The light bulb adapter of claim 1, wherein the commands are generated from a voice recognition software application.

7. The light bulb adapter of claim 1, wherein the function of the light bulb adapter is to turn the light bulb on/off.

8. A light bulb adapter comprising:
a light bulb receptacle configured to receive a light bulb;

a light bulb plug configured to connect to a lighting fixture;

a shell configured to support the light bulb receptacle;

a vent opened through the shell; and a base configured to engage with the shell to form a main housing, wherein the main housing is configured to house electronic circuits that are configured to wirelessly receive commands from a user through a software application installed in a mobile device to control the function of the light bulb adapter, wherein the vent is opened through an upper wall of the shell, and wherein the light bulb adapter further comprises a trench opened through the upper wall of the shell and having two ends, and wherein the vent is located at one of the two ends of the trench.

9. The light bulb adapter of claim 8, wherein the electronic circuits comprise a MCU (microcontroller unit) module, a WACIO/UART (wide area communications IO/universal asynchronous receiver and transmitter) module, and a meter module.

10. The light bulb adapter of claim 8, wherein the light bulb adapter further comprises an antenna for receiving the commands.

11. The light bulb adapter of claim 8, wherein the commands are generated from a voice recognition software application.

12. The light bulb adapter of claim 8, wherein the function of the light bulb adapter is to turn the light bulb on/off.

* * * * *